United States Patent
Timans et al.

(10) Patent No.: US 9,633,876 B2
(45) Date of Patent: *Apr. 25, 2017

(54) SELECTIVE REFLECTIVITY PROCESS CHAMBER WITH CUSTOMIZED WAVELENGTH RESPONSE AND METHOD

(75) Inventors: Paul J. Timans, Mountain View, CA (US); Daniel J. Devine, Los Gatos, CA (US); Young Jai Lee, Sunnyvale, CA (US); Yao Zhi Hu, San Jose, CA (US); Peter C. Bordiga, Petaluma, CA (US)

(73) Assignee: Mattson Technology, Inc., Fremont, CA (US)

( * ) Notice: Subject to any disclaimer, the term of this patent is extended or adjusted under 35 U.S.C. 154(b) by 1779 days.

This patent is subject to a terminal disclaimer.

(21) Appl. No.: 12/776,845

(22) Filed: May 10, 2010

(65) Prior Publication Data

US 2010/0219174 A1 Sep. 2, 2010

Related U.S. Application Data

(60) Continuation of application No. 11/506,174, filed on Aug. 16, 2006, now Pat. No. 7,737,385, which is a
(Continued)

(51) Int. Cl.
- *F27D 11/00* (2006.01)
- *H01L 21/67* (2006.01)
- *F27B 17/00* (2006.01)

(52) U.S. Cl.
CPC .... *H01L 21/67115* (2013.01); *F27B 17/0025* (2013.01)

(58) Field of Classification Search
CPC ............ F27B 17/0025; H01L 21/67115
(Continued)

(56) References Cited

U.S. PATENT DOCUMENTS 3,144,562 A * 8/1964 Emus et al. .................. 250/235
4,579,080 A 4/1986 Martin et al.
(Continued)

FOREIGN PATENT DOCUMENTS

WO WO 03/060447 A1 7/2003

OTHER PUBLICATIONS

Knutson et al, Modeling of Radiation Heat Transfer and Wafer Temperatures in a Complex Three-Dimensional Rapid Thermal Processing Chamber, Aug. 31, 1994, 2$^{nd}$ International Rapid Thermal Processing Conference, Monterey California.
(Continued)

*Primary Examiner* — Tu B Hoang
*Assistant Examiner* — Diallo I Duniver
(74) *Attorney, Agent, or Firm* — Pritzkau Patent Group, LLC

(57) ABSTRACT

A customizable chamber spectral response is described which can be used at least to tailor chamber performance for wafer heating, wafer cooling, temperature measurement, and stray light. In one aspect, a system is described for processing a treatment object having a given emission spectrum at a treatment object temperature which causes the treatment object to produce a treatment object radiated energy. The chamber responds in a first way to the heating arrangement radiated energy and in a second way to the treatment object radiated energy that is incident thereon. The chamber may respond in the first way by reflecting the majority of the heat source radiated energy and in the second way by absorbing the majority of the treatment object radiated energy. Different portions of the chamber may be treated with selectively reflectivity based on design considerations to achieve objectives with respect to a particular chamber performance parameter.

18 Claims, 13 Drawing Sheets

Related U.S. Application Data division of application No. 10/629,400, filed on Jul. 28, 2003, now Pat. No. 7,115,837.

(58) Field of Classification Search
USPC .......................... 219/405, 391; 118/724–725
See application file for complete search history.

(56) References Cited

U.S. PATENT DOCUMENTS

| | | | |
|---|---|---|---|
| 4,938,815 A | 7/1990 | McNeilly | |
| 5,219,786 A | 6/1993 | Noguchi | |
| 5,226,732 A | 7/1993 | Nakos et al. | |
| 5,561,735 A * | 10/1996 | Camm ........................ | 392/416 |
| 5,874,711 A | 2/1999 | Champetier et al. | |
| 5,960,158 A * | 9/1999 | Gat et al. ...................... | 392/416 |
| 5,971,565 A | 10/1999 | Zapata et al. | |
| 5,997,175 A | 12/1999 | Champetier et al. | |
| 6,027,244 A | 2/2000 | Champetier et al. | |
| 6,047,107 A | 4/2000 | Roozeboom et al. | |
| 6,056,434 A | 5/2000 | Champetier | |
| 6,067,931 A | 5/2000 | Ghezzo et al. | |
| 6,127,658 A | 10/2000 | Kohav | |
| 6,259,062 B1 * | 7/2001 | Pan .............................. | 219/390 |
| 6,303,411 B1 | 10/2001 | Camm et al. | |
| 6,410,888 B2 * | 6/2002 | Pan .............................. | 219/390 |
| 6,415,783 B1 * | 7/2002 | Harrison ....................... | 126/683 |
| 6,534,752 B2 | 3/2003 | Camm et al. | |
| 6,594,446 B2 | 7/2003 | Camm et al. | |
| 2001/0025841 A1 * | 10/2001 | Pan .............................. | 219/390 |
| 2001/0047990 A1 | 12/2001 | Yoo | |
| 2002/0102098 A1 * | 8/2002 | Camm et al. ................. | 392/416 |
| 2004/0065657 A1 | 4/2004 | Adams et al. | |
| 2004/0079746 A1 | 4/2004 | Jennings et al. | |
| 2004/0089649 A1 * | 5/2004 | Falter ........................ | 219/444.1 |

OTHER PUBLICATIONS

Burggraaf, Rapid Wafer Heating: Status 1983, Dec. 1983, Semiconductor International, pp. 69-74.
Gelpey et al, Process Control for a Rapid Optical Annealing System, 1986, Mat Res Soc Symp Proc, vol. 52, Materials Research Society.
Wilson et al, an Overview and Comparison of Rapid Thermal Processing Equipment: A Users Viewpoint, 1986, Mat Res Soc Symp Proc, vol. 52, Materials Research Society.
Blake et al, Slip Free Rapid Thermal Processing, 1987, Mat Res Soc Symp Proc, vol. 92, Materials Research Society.
Celler et al, Drift of Arsenic in $SiO_2$ in a Lamp Furnace with a Built-in Temperature Gradient, 1987, Mat Res Soc Symp Proc, vol. 92, Materials Research Society.
Lord, Thermal and Stress Analysis of Semiconductor Wafers in a Rapid Thermal Processing Oven, Aug. 1988, IEEE Trnasactions on Semiconductor Manufacturing, vol. 1, No. 3, pp. 103-114.
Hill et al, Reduced Thermal Processing for ULSI, 1989, Plenum Press, pp. 143-180.
Kakoschke, Is There a Way to a Perfect Rapid Thermal Processing System?, 1991, Mat Res Soc Symp Proc, vol. 224, Materials Research Society, pp. 159-170.
Kakoschke, Simulation of Temperature Effects During Rapid Thermal Processing,, 1989, Mat Res Soc Symp Proc, vol. 146, Materials Research Society, pp. 473-483.
Vandenabeele et al, Impact of Patterned Layers on Temperature Non-uniformity During Rapid Thermal Processing for VSLI-Application, 1989, Mat Res Soc Symp Proc, vol. 146, Materials Research Society, pp. 149-160.
Nulman et al, Pyrometric Emissivity Measurements and Compensation in an RTP Chamber, 1989, Mat Res Soc Symp Proc, vol. 146, Materials Research Society, pp. 461-466.
Dilhac et al, Adaptive Process Control for a Rapid Thermal Processor, 1990, SPIE, vol. 1393, Rapid Thermal and Related Processing Techniques, pp. 395-403.
Dilhac et al, Thermal Model for Rapid Thermal Processors: Theory and Applications, Sep. 8, 1993, $1^{st}$ International Rapid Thermal Processing Conference, Scottsdale, Arizona.
Wei et al, Transient Processing of Titanium Silicides in a Non-Isothermal Reactor, 1985, Mat Res Soc Symp Proc, vol. 35, Materials Research Society, pp. 465-470.
Pettibone et al, The Effect of Thin Dielectric Films on the Accuracy of Pyrometric Temperature Measurements, 1986, Mat Res Soc Symp Proc, vol. 52, Materials Research Society, pp. 210-216.
Dilhac et al, Thermal Modeling of a Wafer in a Rapid Thermal Processor, Nov. 1995, IEEE Transactions on Semiconductor Manufacturing, vol. 8, No. 4, pp. 432-439.
Henda et al, Investigation of the Thermal Behavior of a RTP Furnace, Aug. 1995, IEEE Transactions on Semiconductor Manufacturing, vol. 8, No. 3, pp. 362-365.

* cited by examiner

SELECTIVE REFLECTIVITY PROCESS CHAMBER WITH CUSTOMIZED WAVELENGTH RESPONSE AND METHOD

This is a continuation application of prior application Ser. No. 11/506,174 filed on Aug. 16, 2006 now U.S. Pat. No. 7,737,385; which is a divisional application of application Ser. No. 10/629,400 filed on Jul. 28, 2003 and now issued as U.S. Pat. No. 7,115,837 issued on Oct. 3, 2006 from which priority under 35 U.S.C. §120 is claimed and the disclosures of which are incorporated herein by reference.

BACKGROUND OF THE INVENTION

The present invention relates generally to the field of heat processing a treatment object such as, for example, a semiconductor substrate, and, more particularly to a process chamber having a selective reflectivity profile for use in such heat processing.

Thermal processing of treatment objects such as, for example, semiconductor substrates, usually requires initially ramping the substrate temperature to a high temperature in a process chamber so that a process can be performed at that high temperature. In a so-called "soak" process, the substrate is left at a given process temperature for a specified period of time and is then ramped down in temperature for unloading from the process chamber.

Typical processes include annealing of ion-implantation damage, silicide formation, oxidation, film deposition and densification or reflow of deposited films. In some processes, it is desirable to minimize the time at the high temperature. This can be achieved with what is generally referred to in the art as a "spike" or ultra-shallow junction (USJ) process, wherein the substrate is ramped up to a specified temperature and then is immediately allowed to cool-down. This kind of process has been found to be very useful for annealing ion-implantation damage that is associated with an implanted dopant. That is, the heat treatment serves to maximize electrical activation of the implanted species, as one objective, while minimizing dopant diffusion, as another objective. It is generally accepted in the prior art that these objectives comprise competing interests and that the spike anneal process appears to provide the best-known compromise with respect to optimizing both of these competing objectives. As an example, ultra-shallow p-n junctions can be formed through the combination of low-energy ion implantation with spike anneals. The junctions have the desirable properties of shallow junction depths (typically <~40 nm) as a result of the minimal time at temperature and low sheet resistances (typically <800 $\Omega$/sq.) as a result of the high temperature used to activate the dopants.

The characteristics of the spike process are sometimes described in terms of the peak temperature and the width of the spike, often specified by the time spent above a threshold temperature defined by (peak temperature—$\Delta$T° C.), where $\Delta$T is usually set as 50, 100 or 200° C. Sometimes the process is also characterized by a ramp-up rate and a cool-down rate. It is evident that the ramping and cooling rates will typically affect the peak width of the spike process. Successful spike annealing, that gives the shallowest junctions with the lowest sheet resistances, often requires higher peak temperatures and narrower peak widths. This is especially important for formation of junctions using boron doping, where significant benefits can be gained through spike anneals. A typical spike process can have a peak temperature of 1050° C. and a peak width of approximately 1.7 s for $\Delta$T=50° C.

It is submitted that future device technologies will require further reductions in junction depth and sheet resistance and, hence, it is clear that improved RTP spike processes will be needed. The expected trend is that new processes will mandate a higher process temperature that is accompanied by a narrower peak width. The present invention describes a highly advantageous approach in implementing such a new process, while providing still further advantages.

Temperature measurements in RTP systems, such as described above, are critical with respect to process monitoring and control. When radiation pyrometers are used to measure, for example, wafer temperature, the wafer is observed by the pyrometer through an aperture in the process chamber wall. In some cases, it can be useful to make this chamber wall highly reflecting at the pyrometer wavelength, because this condition tends to increase the effective emissivity of the wafer at the pyrometer wavelength. This effect makes the emission of the wafer more closely resemble that of a blackbody radiator. As a result, the pyrometer readings are less sensitive to temperature measurement errors that arise from inadequate knowledge of the wafer's spectral emissivity at the pyrometer wavelength. This is a well-known principle for reducing temperature measurement errors in pyrometry. Unfortunately, accommodating this emissivity characteristic, relating to pyrometry, may adversely influence other important aspects of RTP system operation. The present invention is considered to resolve this difficulty, as will be described below, while providing still further advantages.

SUMMARY OF THE INVENTION

As will be discussed in more detail hereinafter, there is disclosed herein a system and associated method for processing a treatment object having a given emission spectrum at a treatment object temperature so as to produce a treatment object radiated energy. The system includes a heating arrangement for heating the treatment object using a heat source radiated energy having a heat source emission spectrum at a heat source operating temperature which heat source emission spectrum is different from the given emission spectrum of the treatment object. Chamber defining means is provided for use in exposing the treatment object to a portion of the heating arrangement radiated energy while supporting the treatment object within a treatment chamber such that a first fraction of the heating arrangement radiated energy and a second fraction of the treatment object radiated energy are incident on the chamber defining means bounding the treatment chamber. The chamber defining means is configured for responding in a first way to a majority of the first fraction of the heating arrangement radiated energy that is incident thereon and for responding in a second way to a majority of the second fraction of the treatment object radiated energy that is incident thereon. In one feature, the chamber defining means is configured to respond in the first way by reflecting the majority of the heat source radiated energy and to respond in the second way by absorbing the majority of the treatment object radiated energy.

In another aspect of the present invention, a system and associated method are described for processing a treatment object. The system originally includes an unmodified chamber arrangement for receiving and supporting the treatment object during processing. The unmodified chamber arrangement provides a given maximum cooling rate of the treatment object after being heated within the unmodified chamber arrangement, a modified chamber arrangement is used to replace the unmodified chamber arrangement. The modified chamber arrangement includes chamber defining means for supporting the treatment object therein and is configured for providing a modified maximum cooling rate that is greater than the given maximum cooling rate.

In still another aspect of the present invention, a system and associated method are described for processing a treatment object having a given emission spectrum at a treatment object temperature so as to produce a treatment object radiated energy. The system includes a heating arrangement for heating the treatment object using a heat source radiated energy having a heat source emission spectrum at a heat source operating temperature which heat source emission spectrum is different from the given emission spectrum characteristic of the treatment object. Chamber defining means is used for exposing the treatment object to a portion of the heating arrangement radiated energy while supporting the treatment object within a treatment chamber such that a first fraction of the heating arrangement radiated energy and a second fraction of the treatment object radiated energy are incident on the chamber defining means bounding the treatment chamber, and the chamber defining means being configured to respond with selective reflectivity to the first fraction of the heating arrangement radiated energy and the second fraction of the treatment object radiated energy.

In a continuing aspect of the present invention, a system and method are described for processing a treatment object having a given emission spectrum at a treatment object temperature which causes the treatment object to produce a treatment object radiated energy. A heating arrangement heats the treatment object using a heating arrangement radiated energy having a heat source emission spectrum at a heat source operating temperature which heat source emission spectrum is different from the given emission spectrum of the treatment object. Sensing means senses the treatment object radiated energy at a sensing wavelength. Chamber defining means is used for exposing said treatment object to a portion of the heating arrangement radiated energy while supporting said treatment object within a treatment chamber, at least one portion of the chamber defining means is configured for simultaneously (i) responding in a first way to a majority of the heating arrangement radiated energy that is incident thereon, (ii) responding in a second way to a majority of the treatment object radiated energy that is incident thereon and (iii) responding in a third way at the sensing wavelength.

In a further aspect of the present invention, a system and method are described for processing a treatment object having a given emission spectrum at a treatment object temperature which causes the treatment object to produce a treatment object radiated energy. A heating arrangement heats the treatment object using a heating arrangement radiated energy having a heat source emission spectrum at a heat source operating temperature which heat source emission spectrum is different from the given emission spectrum of the treatment object. Sensing means senses the treatment object radiated energy emitted by the treatment object at a sensing wavelength. Chamber defining means supports the treatment object during its exposure to the heating arrangement radiated energy within a treatment chamber. At least a first portion of the chamber defining means is configured for reflecting a majority of the sensing wavelength that is incident thereon, and at a second, different portion of the chamber defining means is configured for selectively absorbing a majority of the sensing wavelength that is incident thereon.

In another aspect of the present invention, a system and method are described for processing a treatment object. A heating arrangement is used for heating the treatment object with a heating arrangement radiated energy. Chamber defining means is provided for use in exposing the treatment object therein to one portion of the heating arrangement radiated energy, while another portion of the heating arrangement radiated energy is incident on the chamber defining means, resulting in an overall radiated energy present within the chamber defining means. The chamber defining means includes a window between the heating arrangement and the treatment object such that the window is opaque, at least to an approximation, above an opacity onset wavelength. At least a portion of the chamber defining means includes a selectively reflective configuration which responds in a first way to a majority of the overall radiated energy incident thereon which is of a shorter wavelength than the opacity onset wavelength while responding in a second way to a majority of the overall radiated energy that is incident thereon and which is of a longer wavelength than the opacity onset wavelength.

BRIEF DESCRIPTION OF THE DRAWINGS

The present invention may be understood by reference to the following detailed description taken in conjunction with the drawings briefly described below.

DETAILED DESCRIPTION OF THE INVENTION

Figure 1:
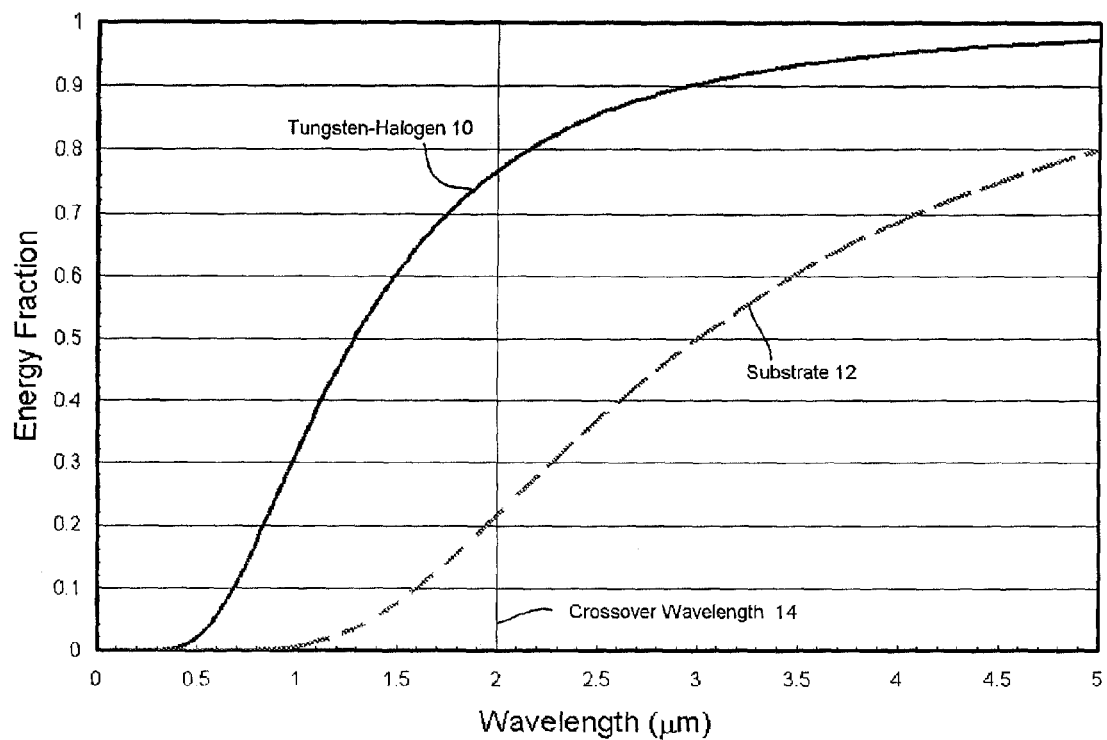
FIG. 1 is a plot of energy fraction versus wavelength shown here for purposes of comparing the energy fraction of a radiant lamp heating arrangement with the energy fraction of radiant energy from a substrate, as wavelength increases.

In a typical lamp-heated RTP system, it is recognized that limitations on peak width of a heating profile can be attributed to three main factors. First, the ramp-up rate is limited by the power available from the energy source used to heat the substrate, coupled with the efficiency with which that power is delivered to the wafer surface. It is noted that tungsten-halogen lamps are used in a number of prior art systems, however, it is to be understood that the present invention may be practiced using any suitable heating arrangement and is in no way limited to the use of such lamps, so long as the teachings herein are applied. As examples, the present invention contemplates the use of flash lamps and arc lamps. A second limitation arises due to the thermal response time of the energy source. For example, in the case where tungsten-halogen lamps are used as the energy sources for heating the substrate, the finite thermal mass of the tungsten filament in this lamp is a limitation which governs how fast the lamp can cool and, in turn, limits how fast the power being delivered to the substrate can be switched off. The third limitation derives from the cooling rate of the substrate. The cooling rate is limited by the combination of the thermal mass of the substrate and the efficiency with which heat can be lost from the substrate surfaces, typically by thermal radiation or by convective and conductive heat losses through the process gas that surrounds the substrate. As will be seen, the present invention focuses on the first and third of these limitations in a highly advantageous way which serves to improve efficiency of coupling heat source radiation to the treatment object, during operation of the heat source, while improving efficiency of heat loss from the treatment object post-exposure to the heat source.

The heat transfer to a substrate being heated by lamps in a processing chamber can be approximated by the equation:

$$\rho c D \frac{dT}{dt} = \eta P - H_{eff} \sigma T^4, \tag{1}$$

where T is the absolute temperature of the substrate, t is time, P is the lamp power density, $\sigma$ is the Stefan-Boltzmann constant, $\rho$ is the density, c is the specific heat capacity, D is the thickness of the substrate, $\eta$ is the fraction of the lamp power coupled to the substrate and $H_{eff}$ is the effective heat loss efficiency. The power may be incident from one side or both sides of the object being heated (processed), and $H_{eff}$ includes the possibility of heat loss from both sides of the object, as well as the effect of re-reflection of the emitted radiation back onto the object. The terms $\eta$ and $H_{eff}$ depend on the optical properties of both the substrate and the chamber. In equation (1), it has been found to be reasonable to assume that T is sufficiently high such that the heat transfer is dominated by radiation, and that there are no significant convective or conductive heat losses from the substrate.

While equation (1) can be used to predict the thermal responses of substrates and other treatment objects, when they are subjected to radiant heating, it is recognized that this equation can advantageously be used for purposes of understanding what amount to fundamental limits on heating and cooling rates in the contemplated treatment environment. For example, the maximum ramp-up rate, $R_{max}$, can be obtained by rearranging the equation to obtain:

$$R_{max} = \frac{\eta P_{max} - H_{eff} \sigma T^4}{\rho c D}, \tag{2}$$

where $P_{max}$ is the maximum lamp power density available from the heating system. In contrast, a maximum cooling rate, $C_{max}$ is given by the equation:

$$C_{max} = \frac{H_{eff}\sigma T^4}{\rho c D}. \qquad (3)$$

In order to maximize the heating and cooling rates, it is advantageous to design the system so that $R_{max}$ and $C_{max}$ are each as large as possible. To that end, an inspection of equation (2) shows that for a high ramp-up heating rate, it is desirable to make $\eta$ as high as possible and to minimize $H_{eff}$. Unfortunately, however, equation (3) suggests that a large cooling rate requires maximizing $H_{eff}$. At first blush then, considering both equations, it appears that maximizing $H_{eff}$ is an interest that competes directly against maximizing $R_{max}$.

The present invention resolves this competing interest, however, by recognizing that, during a high-speed ramp-up, in what is considered to be a practical rapid thermal processing ("RTP") system, the magnitude of $\eta P_{max}$ is very much larger than the magnitude of $H_{eff}\sigma T^4$. With this highly advantageous recognition in hand, system performance can be optimized by maximizing $\eta$ and $H_{eff}$. At the same time, it should be appreciated that these quantities are affected by treatment object properties. For example, in the instance of an treatment object, it is further recognized that such an object's optical properties such as, for example, those of a semiconductor substrate, are typically defined by specific manufacturing requirements and may not readily be modified in the interest of achieving high ramp-up rates and cool-down rates. Such modifications, for example, could include making the substrate thinner or the application of surface coatings that emit thermal energy more efficiently or absorb lamp energy more efficiently. Moreover, it is considered to be unlikely that any one substrate treatment will provide universal advantages with respect to a particular one of any number of possible processing regimes to which that substrate may be subjected. It is important to understand, in contrast, that the advantages that are provided by the present invention apply to a broad range of available substrates. That is, the substrate parameters that do influence the practice of the present invention, over a relatively wide variety of substrates, are generally within a range of variation which produces little appreciable difference in a target outcome of the RTP objectives of the present invention. This is considered as a sweeping advantage, in and by itself, since the present invention requires no modifications as to the substrate, but modifies only the treatment chamber in a way, which provides universal advantages with respect to a broad array of substrates.

In order to optimize system design in accordance with the foregoing highly advantageous teachings and recognitions, it is useful to consider those factors in chamber design, which determine $\eta$ and $H_{eff}$. As one alternative, a high value for $\eta$ is achieved by making the chamber walls highly reflective. This result obtains for two reasons. Firstly, energy that is emitted from the lamps in the direction of the chamber wall can reflect back, towards the substrate. High reflectivity walls absorb little energy and advantageously return much of the lamp radiation in the direction of the substrate. Secondly, the lamp energy that is reflected from the substrate surface will be re-reflected by the chamber wall and can have continuing opportunities to be absorbed by the substrate. In the limiting case of a perfect chamber reflector, all of the lamp energy would be absorbed by the substrate.

If the walls are reflecting, so as to provide the aforedescribed advantages with respect to the lamp radiation, then energy emitted by the substrate will likewise be re-reflected back onto the substrate surface, thereby disadvantageously reducing the net heat loss with respect to cooling the substrate. In the limiting case of perfectly reflecting walls, the substrate would not be able to lose heat by radiation.

As another alternative, a high value for $H_{eff}$ is achieved by making the chamber walls highly absorbing. If the walls are perfectly black, then none of the energy lost by radiation from the substrate surface can return to the substrate. However, in this instance, lamp radiation is disadvantageously absorbed.

It is noted that the prior art has generally opted for one or the other of these two alternatives, even though performance is compromised with respect to the non-elected alternative. In some instances, individual chamber and component surfaces within a particular treatment system have been selectively configured in accordance one of these alternatives in order to accomplish specific objectives with respect to the particular surface that is of concern. For example, heat sensitive components can be coated so as to be highly reflective, whereas reflector plates can be black for purposes of conducting heat away from the treatment chamber. The present invention, however, recognizes that these apparently conflicting requirements, as defined by these two essentially opposite alternatives, can be resolved in a highly advantageous way, as will be seen below.

As one example of a highly reflective prior art arrangement, aluminum chamber walls have been used including a polished surface. Such a polished surface can receive a plating using, for example, gold. As another example, a matte aluminum surface can be plated with gold (resulting in a matte gold finish). With respect to polished aluminum (with or without gold), it is submitted that small changes in the quality of the polished surface result in large differences in reflectivity, which then results in chamber to chamber performance differences. A matte gold finish appears to provide more consistent results in terms of chamber to chamber consistency. Both aluminum and gold, however, are broad band reflectors, as will be further described, in that they have high reflectivity in both the visible and in the near and mid-infrared regions of the energy spectrum.

Attention is now directed to FIG. 1 which is a plot of Energy Fraction against increasing wavelength, shown here to illustrate the fraction of energy emitted below a specified wavelength, for the cases of blackbody radiators at temperatures of approximately 3200° K. and 1373° K., wherein the plots are referred to by the reference numbers 10 and 12, respectively. The higher temperature of 3200° K., for plot 10, is representative of the temperature of the filaments in a W-Halogen lamp that may be used in an RTP system. The lower temperature of 1373° K., for plot 12, is representative of the temperature of a substrate at the peak point of a spike anneal process at 1100° C. Specifically, it is recognized that the emission spectrum from the substrate and heating arrangement such as, for example, Tungsten-Halogen lamps, are quite different. Consistent with this recognition, it is further recognized that a chamber wall that is simultaneously highly reflecting for the lamp radiation and highly absorbing for the radiation emitted by the substrate provides heretofore unseen advantages. The key, in this regard, is to make the chamber behave with "selective reflectivity", i.e., its reflectivity varies with wavelength. In essence, the use of such selective reflectivity materials presents a first reflectivity profile to the heating arrangement energy while presenting a second, different reflectivity profile to the substrate radiated energy, as will be further described.

The reflectivity of an object is often, at least to some limited extent, a function of the wavelength, $\lambda$, of the electromagnetic radiation incident on it. The variation of reflectivity with wavelength is described by the function $R(\lambda)$ that depends on the optical properties of the materials comprising the object and the physical structure of the object. This variation with wavelength is described as the reflection spectrum of the object.

Any electromagnetic radiation source, including any thermal energy source, has an emission spectrum, $S(\lambda)$, that describes the power emitted by the source at any given wavelength. In a small wavelength range $\Delta\lambda$ around the wavelength $\lambda$, the source emits a power $S(\lambda)\Delta\lambda$. The power radiated by the source in any wavelength interval can be calculated by integrating the emission spectrum over the wavelength range of interest, for example from $\lambda_1$ to $\lambda_2$:

$$P_{\lambda_1,\lambda_2} = \int_{\lambda_1}^{\lambda_2} S(\lambda)d\lambda. \qquad (4)$$

The total power radiated by the source is obtained from the integral $$P_{source,total} = \int_0^\infty S(\lambda)d\lambda. \qquad (5)$$

When radiation from this energy source falls on an opaque object, the radiation can be reflected or absorbed. The amount of power that is reflected at any given wavelength is determined by the product of the spectral reflectivity and the incident power. Hence the total power reflected in the wavelength range from $\lambda_1$ to $\lambda_2$ is given by the integral:

$$P_{reflected,\lambda_1,\lambda_2} = \int_{\lambda_1}^{\lambda_2} R(\lambda)S(\lambda)d\lambda. \qquad (6)$$

A total reflectivity, $R_{tot,S}$ is defined for the object with respect to the radiation from the source S, as equaling the ratio of the total power incident on the surface to the total power reflected from the surface:

$$R_{total,S} = \frac{P_{reflected,total}}{P_{source,total}} = \frac{\int_0^\infty R(\lambda)S(\lambda)d\lambda}{\int_0^\infty S(\lambda)d\lambda}. \qquad (7)$$

It should be emphasized that this integrated property, $R_{total,S}$, is a function of both the object and of the illumination spectrum.

The concept of selective reflection arises in a situation such as is contemplated by the present invention, wherein an object interacts with radiation from two energy sources A and B, with spectra $SA(\lambda)$ and $SB(\lambda)$ respectively. Two total reflectivities can be defined with respect to these two spectra, $R_{total,SA}$ and $R_{total,SB}$ through the use of equations similar to (7). In this example case, the source spectra $SA(\lambda)$ and $SB(\lambda)$ may be quite different, so in general $R_{total,SA} \neq R_{total,SB}$. If there is a significant difference between the two quantities, then the object can be said to show selective reflection behavior with respect to energy source A and source B.

Typically, useful selective reflectors have reflection spectra that include large variations in reflectivity as the wavelength varies. For example, the reflectivity may be high in one wavelength range and then fall to a low value in a second wavelength range. In this case, it is recognized that, if source A predominantly radiates energy in the first wavelength range and source B predominantly radiates energy in the second wavelength range, then the total reflectivity will be high for source A and low for source B and the object is considered by the present invention as a selective reflector.

This concept is equally applicable with respect to the absorption of radiation. Equivalent properties can be developed for absorbtivity at any wavelength, and for integrated absorbtivity that describes the total power an object absorbs in a given wavelength range when illuminated by a given energy source. An object that exhibits significant differences in its absorption behavior with respect to two energy sources is a selective absorber. Typically, this behavior arises when the object has high values of absorbtivity in one wavelength range and a low value in a second range.

The concept of selective emission may also be employed. According to Kirchhoff's law, the absorptivity and emissivity at any given wavelength must be equal. This law applies for identical optical conditions including wavelength, incident angle and polarization state. As a result, a selective absorber will usually emit significantly more thermal radiation in one wavelength range than it does in a second wavelength range. This behavior may be referred to as selective emission.

Still considering FIG. 1, it is evident that greater than 75% of the radiation from the lamp heating arrangement is emitted at wavelengths less than 2 µm, whereas greater than 75% of the radiation from the substrate is emitted at wavelengths greater 2 µm. Hence, a reflector that has a high reflectivity for wavelengths of less than approximately 2 µm and a low reflectivity for wavelengths greater than approximately 2 µm simultaneously provide a high value for $\eta$ and yet a low value for $H_{eff}$. The wavelength selection or breakover point for a particular chamber peripheral arrangement can be referred to as a "crossover" wavelength. In the present example, the 2 µm crossover wavelength is designated by the reference number 14. Below the crossover point, the chamber walls (or at least some portion thereof) reflect a majority of the heating arrangement emitted energy incident thereon while, above the crossover point, the chamber walls absorb a majority of the substrate emitted energy incident thereon.

With respect to this advantageous dual behavior, it is important to realize that any suitable wavelength can be selected for the crossover wavelength, depending on the desired results. In some applications, where only modest increases in cooling rate are desired, it may be desirable to make a crossover between high and low reflectivity at a longer wavelength, for example, approximately 3 µm. In other cases, maximization of the cooling rate may be more important and the crossover wavelength could be shifted for example to 1.5 µm. If the energy source is, for example, an arc lamp, then most of the emission spectrum is at much shorter wavelengths and the crossover could be at 1 µm, without having a detrimental effect on the heating rate. More particularly, the chamber may exhibit a high reflectivity at relatively short wavelengths (for example, less than approximately 2 µm wavelength) where the heating arrangement emits most of its energy and a low reflectivity at relatively long wavelengths (for example, greater than approximately 2 µm wavelength) where the substrate emits most of its energy.

With respect to chamber walls, it is recognized that both aluminum and gold are broad band reflectors in both the visible and in the near and mid-infrared regions of the energy spectrum. Further, the far infrared (above approximately 8 µm) is not of great concern, in the instance of a semiconductor substrate or wafer, as the amount of wafer energy in that region is less than 10% of the energy emitted by the wafer, when the wafer has been heated to a temperature typically used for rapid thermal processing. Still further, the amount of lamp energy in the far-infrared is typically less than 5% of its total emitted energy.

Having described the recognitions above that have brought the present invention to light, attention is now directed to a number of different embodiments for use in its practice. To that end, attention is initially directed to FIG. 2 which diagrammatically illustrates a first embodiment of a treatment system that is produced in accordance with the present invention and generally indicated by the reference number 50. System 50 includes a heating arrangement 52 that is made up of a plurality of Tungsten-Halogen lamps, only one of which lamps is shown for purposes of clarity. Again, it is to be understood that any alternative heating arrangement is considered to be within the scope of the present invention so long as the teachings herein are applicable. As one example, the use of an arc lamp heating arrangement is contemplated. As another example, another heating arrangement is often positioned below the treatment object in the elevational view of this figure, which has not been shown for purposes of clarity. Lamp 52 emits a radiant energy 54 consistent with plot 10 of FIG. 1. This heating arrangement emitted energy is illustrated using arrows having a stem which alternates at a relatively short wavelength. It is noted that like reference numbers have been applied to like components throughout the various figures wherever possible. Moreover, it is to be understood that terminology that is applied with reference to the views of one or more of the figures such as for example "frontmost", "rearmost", "upper", "lower", "outer" and "inner" is used solely for purposes of descriptive clarity and is in no way intended as being limiting. Further, it is noted that the drawings are not to scale and have been presented in a way that is intended to enhance the reader's understanding.

Figure 2:
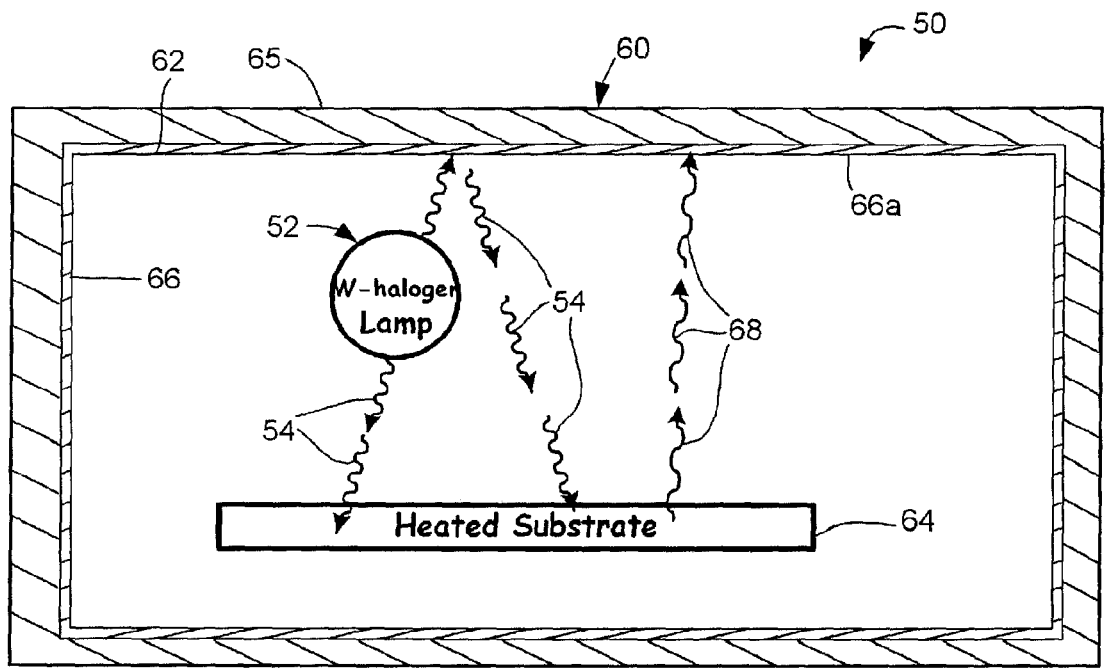
FIG. 2 is a diagrammatic cross-sectional view, in elevation, of a treatment chamber produced in accordance with the present invention having an inner coated layer, which exhibits a selective reflectivity characteristic.

Still referring to FIG. 2, system 50 further includes a chamber arrangement 60 which defines a treatment chamber 62 for receiving and supporting a treatment object 64 therein. Treatment object 64 may comprise, for example, a semiconductor substrate, as described above. The substrate may be supported, for example, on a conventional pedestal (not shown). Treatment chamber 60 is shown in cross-section and is configured in accordance with the present invention having an outer wall arrangement 65 supporting an inner layer 66 which surrounds an interior periphery. Wall arrangement 65 may be formed, for example, using aluminum having a thickness that is sufficient to ensure structural integrity. It is noted that a "wall arrangement", as well as the terms "wall" and "wall member", as used throughout this disclosure and the appended claims, are not intended to encompass a window which may be interposed between the heating arrangement and the treatment object. Once heated to an appropriate temperature, treatment object 64 emits a treatment object radiated energy 68 having a relatively long wavelength, as compared to radiant energy 54 from heating arrangement 52.

Continuing to refer to FIG. 2, inner layer 66 may be formed, in one implementation, using any suitable material as a coating in view of the reflectivity of the selected material. The coatings can be applied by any number of well known methods including painting, spraying, plasma spraying or other deposition methods. Applicants formulated and tested a number of coatings. Candidate materials were selected based on diffuse and specular reflectivity. Additionally, the ability to readily formulate coatings, using a selected material, played a factor in the selection process. Accordingly, the list of appropriate materials presented herein is not considered to be exhaustive but, rather, exemplary.

Figure 3:
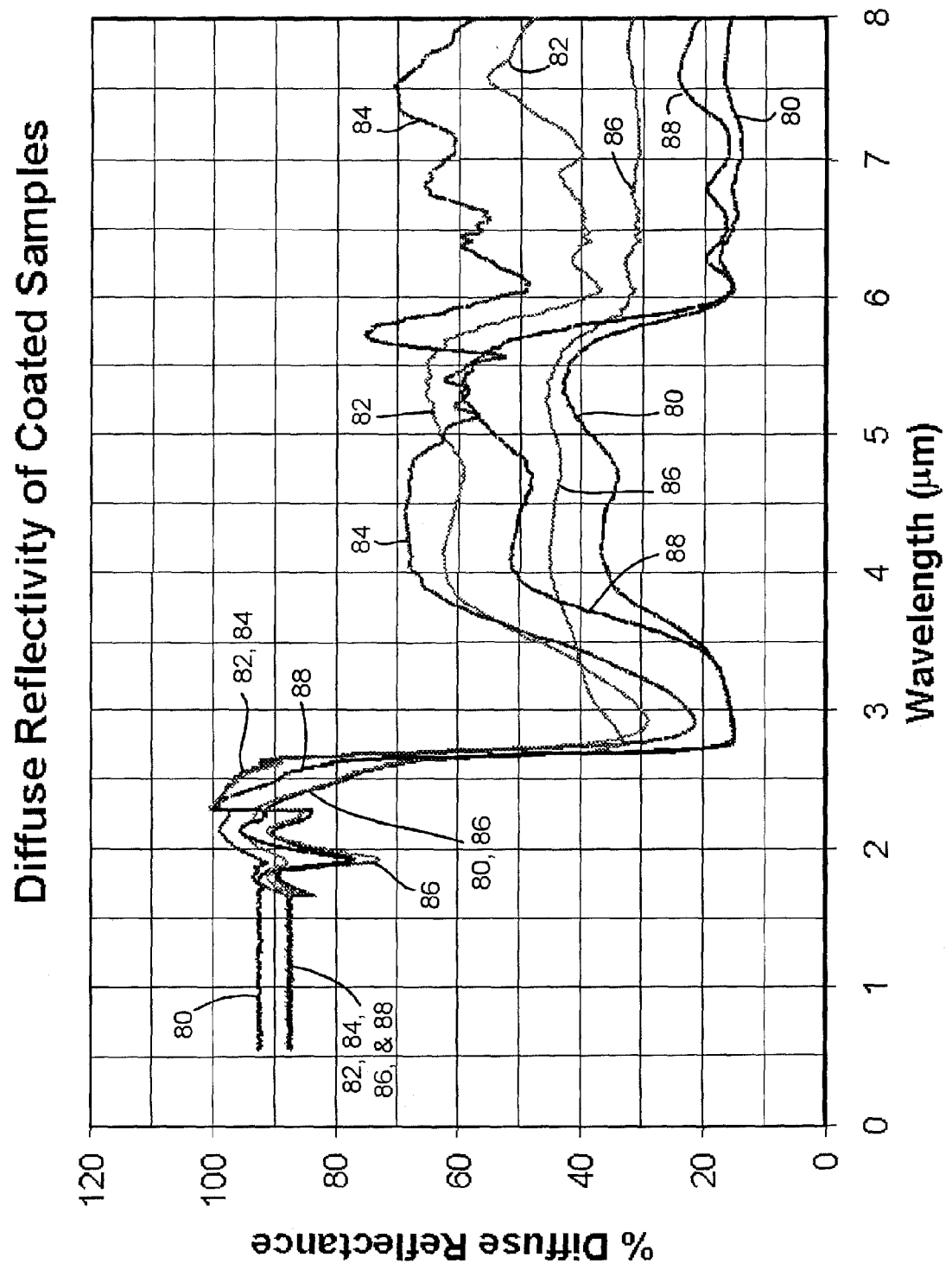
FIG. 3 is a plot of diffuse reflectance against wavelength for a number of selected materials, which exhibit selective reflectivity characteristics that are useful in view of the teachings herein.

Referring to FIGS. 2 and 3, the latter illustrates diffuse reflectance of various coated samples for selected formulated coating materials, plotted against wavelength in µm. While diffuse reflectivity is illustrated, it was found that the diffuse and specular reflectivities both exhibit general drops at approximately the same wavelength and within the region of interest. Accordingly, the wavelength response is properly characterized in terms of general reflectance. A plot 80 corresponds to aluminum oxide. This plot, along with the remaining plots of FIG. 3, was obtained from infrared reflection spectroscopy measurements. Aluminum oxide was demonstrated to be useful in forming layer 66 for a number of reasons, when applied as one of the tested coatings, using a plasma spray. First, the aluminum oxide layer becomes mechanically and chemically bonded to an underlying aluminum chamber wall. As such, the coated layer is very adherent to its metal substrate. Second, aluminum oxide is a totally inorganic oxide and, therefore, it will not oxidize in a hot atmospheric environment—its optical properties will not drift or change appreciably over time. It should be noted, however, that aluminum oxide can, at least potentially, become contaminated due to the absorption of contaminants that may be present, for example, in air that is used to cool the Whalogen lamps. Accordingly, such contaminants should be rendered unavailable in the cooling air. Third, an aluminum oxide coating does not require post application processing. Fourth, coating properties are considered to be very repeatable from application cycle to application cycle. Fifth, the coating can be applied very thin (at a thickness from approximately 1 nm to 1.5 millimeter) and, as such, it does not appreciably change the ability of a component such as, for example, an aluminum reflector plate, which backs lamp arrangement 52, to extract heat absorbed by the coating. Thus, the coating is allowed to operate at a temperature of no more than approximately 120 degrees C., thereby minimizing stress between the coating and the substrate to which it is applied. It is noted that a lamp reflector plate is represented by an upper wall portion 66a of overall layer 66 which coats the chamber wall nearest lamp arrangement 52. In this regard, it should be appreciated that there is no requirement to coat all of the interior chamber walls. Moreover, it is to be expected that coating 66a provides for maximized returns in the event that it is desired to coat only a portion of the chamber interior, since it most directly confronts the major/treatment surface of treatment object 64, as well as directly confronting heating arrangement 52, so as to be intensely exposed thereto.

It is considered that a diffuse selective reflective coating should be more uniform, in terms of its optical response, than a polished surface such as, for example, polished aluminum. Obtaining a polished aluminum surface that is sufficiently optically uniform across its entire surface is difficult. This result obtains at least for the reason that even small changes in the surface roughness can cause significant non-uniformity in terms of optical response. A bare polished aluminum surface is sensitive to corrosion, as well as surface contamination. Moreover, it is a soft surface and is easily scratched. Any contamination that is absorbed onto the surface will also affect its optical properties, likely in a non-uniform way. In contrast, a diffuse selective reflective coating should generally be more stable in terms of corrosion and contamination resistance, depending on the exact composition of the coating material. In the case of plasma sprayed aluminum oxide, the coating is essentially a ceramic coating and is comparatively extremely stable and generally insensitive to contamination. Moreover, an aluminum oxide plasma coating exhibits scratch resistance.

The remaining plots in FIG. 3 correspond to materials that were generally formulated as paints and tested as described above. These materials can be provided having any suitable thickness, for example, in a range from about 0.01 mm to 1.5 millimeter. It was found that these particular white paints introduce the desired wavelength selection effect, although there is no need for the paint to appear white. Specifically, plot 82 corresponds to Titanium dioxide ($TiO_2$); a plot 84 corresponds to Zirconium silicate($ZrSiO_4$); a plot 86 corresponds to Zirconium dioxide/Yttrium oxide ($ZrO_2/Y_2O_3$); and a plot 88 corresponds to Titanium dioxide/silicon dioxide ($TiO_2/SiO_2$). The paint that was used to carry these various materials was formulated using organic and inorganic binders. It is submitted that one of ordinary skill in the art may readily devise any number of such formulations for purposes of applying these materials in a coating, in view of this overall disclosure. Each paint was then spray applied to an aluminum base plate. The organic binder was then burned out in an oven at approximately 400 degrees C., so that only the materials of interest remained, along with a very small fraction by weight of the inorganic binder.

It is readily observed in FIG. 3 that each reflectance plot for these various materials exhibits a significant drop in reflectance between 2 µm and 3 µm in wavelength. Moreover, the reflectance for each plot, in general, does not fully recover with further increasing wavelength. Accordingly, these materials, or combinations thereof, are all considered as useful candidates for forming inner layer 66. A useful material should exhibit a general drop in reflectivity in the wavelength range from about 1 µm to 10 µm. Materials which exhibit a drop in a narrower wavelength range from about 2 µm to 3 µm are considered to be particularly useful. A crossover at about 2 µm is particularly useful with the use of Tungsten-Halogen lamps, as demonstrated by FIG. 1.

Other materials are also considered as important including, but not limited to Potassium Di-hydrogen Orthophosphate, Aluminum Orthophosphate Magnesium Pyrophosphate, Boron Phosphate and Yttrium Phosphate. Coatings using these materials, for purposes of serving as selective reflectors, are preferred to be diffuse (matte) in order to improve chamber to chamber matching.

Generally, a useful coating may contain atomic bonds, potentially introduced as impurities, that are known to introduce absorption of infrared energy at the wavelengths of interest. For example, it is known that the O—H bond, and associated Si—O—H and Al—O—H bonds introduce strong absorption features and, consequently, low reflectivity at wavelengths in the near IR, especially between 1.4 and 3 µm. Materials that incorporate water, either directly as $H_2O$ or in some other configuration, are also likely to exhibit this useful characteristic. The effects of hydrogen bonding can also provide useful spectral features. Other bond groups that introduce useful spectral features include carbonates, $CO_3$, nitrates, $NO_3$, and bonds between elements and hydrogen, for example C—H bonds and N—H bonds. Di-hydrogen potassium phosphate also has a very sharp cut-off at approximately 2 microns.

In many instances, the white characteristic of a coating arises from the main constituent material being transparent at visible wavelengths. These materials appear white because they are present in a finely divided form that greatly increases the scattering of light. The best analogy here is between a large block of ice, which is transparent, and snow, which is bright white. The coating properties then frequently combine the desirable characteristic of being a material that is highly transparent at wavelengths below the crossover wavelength, and absorbing at wavelengths greater than the crossover wavelength. Examples of suitable materials that are inherently transparent in the lamp radiation band are $SiO_2$, $Al_2O_3$ and $TiO_2$, although there are many others. It is important to realize that many of these materials exhibit useful absorption features only as a result of the presence of introduced impurities, as mentioned above. In many cases, the properties can be optimized by blending components that are transparent with others that are absorbing. It can also be useful to optimize the size and the refractive index of the grains of material that produce the light scattering, as well as the absorbing effects.

Referring to FIG. 2, it should be appreciated that the ratio of energy reflected above and below the crossover wavelength, for example, 2 µm can also be tuned by adjusting the surface roughness of a particular coating or the surface of a bulk material having selective reflectivity properties, yet to be described.

Other materials that contain strong absorption features that may be useful include metal oxides as well as other crystals, ceramics and even plastics. These materials can also be prepared in forms that maximize their reflectivity in the short-wavelength band. For example, a polymer layer may be used. Suitable polymers include, but are not limited to fluoropolymers and chloro-fluoro-polymers with or without filler materials. These polymers include, for example, polytetrafluoroethylene, ethylene-tetrafluorethylene, ethylene-trifluoroethylene, fluorinated ethylene propylene, ethylene-chloro trifluoroethylene, polyvinylidene fluoride, polychlorotrifluoroethylene, perfluoroalkoxy, related materials and combinations thereof. A polymer based layer may include filler materials including, but not limited to aluminum oxide particles, titanium dioxide particles, mixtures of aluminum dioxide and titanium dioxide particles, glass particles, glass fibers, and other filler materials that are capable of modifying the optical reflectivity of an appropriate base polymer.

Figure 4:
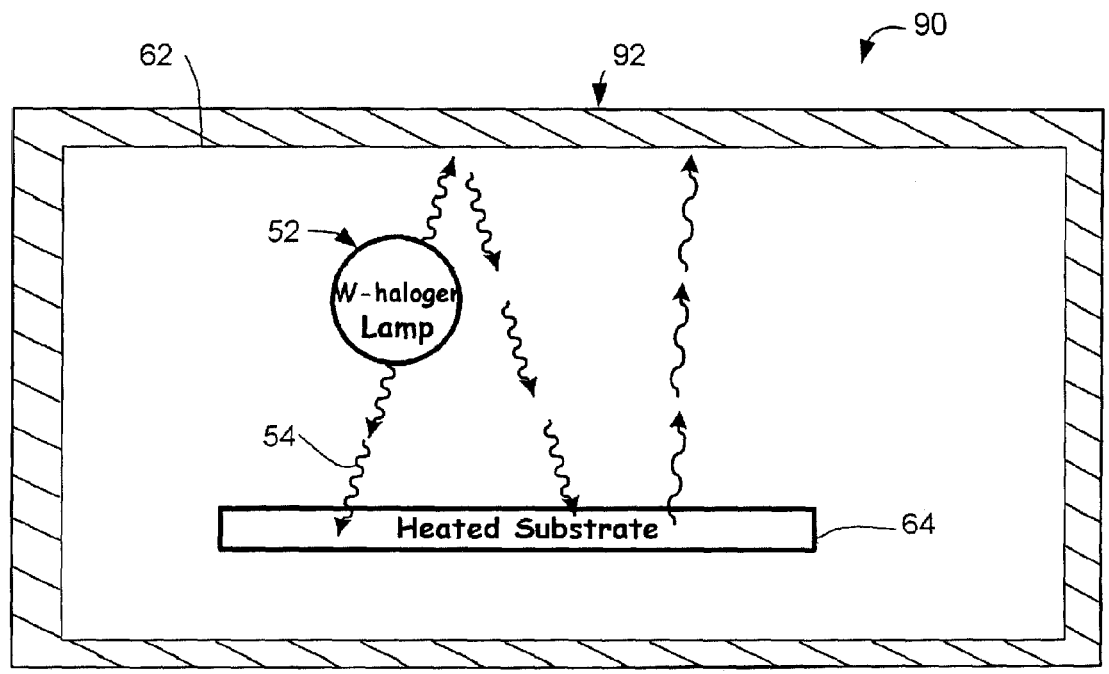
FIG. 4 is a diagrammatic cross-sectional view, in elevation, of another treatment chamber that is produced in accordance with the present invention having a chamber wall arrangement that exhibits desired bulk material properties.

Referring to FIG. 4, another embodiment of a system, produced in accordance with the present invention, and generally indicated by the reference number 90, includes a chamber arrangement that is formed of bulk materials with the desired properties, rather than using an applied coating. One example is the use of an opaque quartz (fused silica) wall arrangement 92 that includes a high concentration of OH bonds. The opaque quartz is quartz that includes a very large density of microscopic bubbles that strongly scatter light, giving it a bright white appearance. This is an alternative approach for turning an inherently transparent material such as quartz, into a highly reflecting object that looks white. By incorporating OH bonds or other impurities, strong absorption features can be created at wavelengths beyond approximately 2 µm. As another example, the chamber walls may be formed using alumina which essentially comprises a bulk ceramic material.

Figure 5:
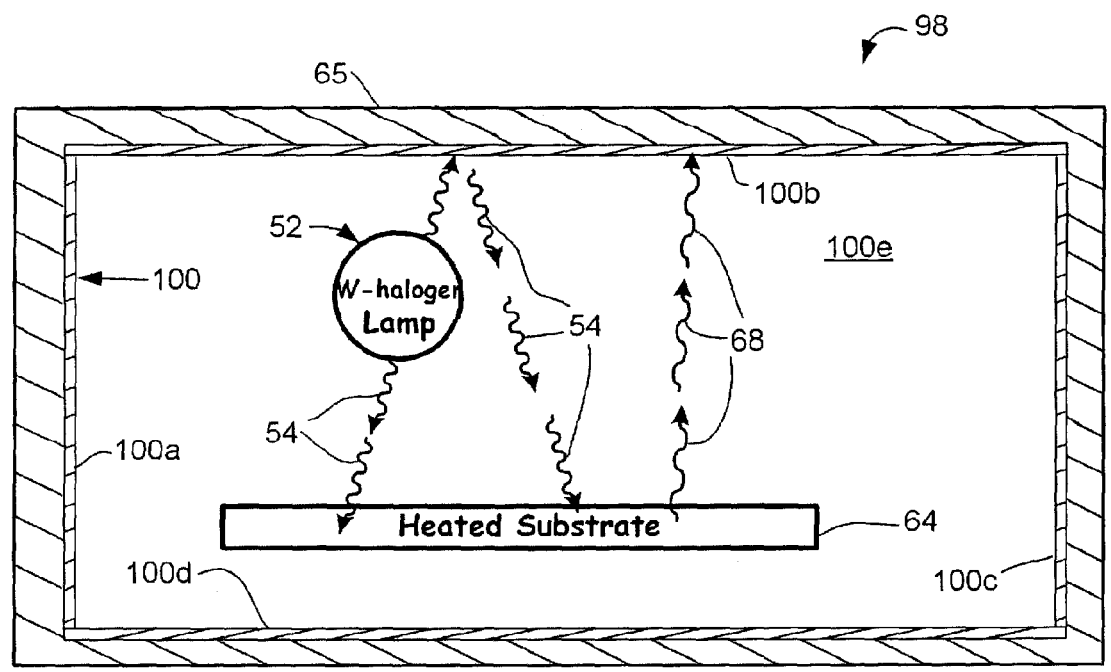
FIG. 5 is a diagrammatic cross-sectional view, in elevation, of still another treatment chamber that is produced in accordance with the present invention having a chamber wall arrangement that is lined with sheet material members having desired selective reflectivity characteristics.

Turning to FIG. 5, another embodiment of a system, produced in accordance with the present invention, and generally indicated by the reference number 98, uses an arrangement of one or more members of sheet material to line one or more interior peripheral surfaces of outer wall arrangement 65. In the present example, an arrangement of five sheet members is indicated using the reference numbers 100a-e (which may be referred to collectively as sheet members 100), wherein sheet 100e is supported against the rear wall of the chamber in the view of the figure. The frontmost wall of the treatment chamber is not visible in the present view, but may likewise support a sheet material member. The approach of this embodiment is advantageous with respect to allowing the use of underlying metal structural walls in forming an overall cooled isolation barrier. Again, there is no requirement to line, or treat according to any embodiment described herein, every interior chamber surface. For example, only the upper surface could be treated. Further, there is no requirement to cover the entirety of any one surface. For instance, only that portion of the upper surface which is immediately adjacent to the heating arrangement could be coated or otherwise treated. It is considered that one useful embodiment is provided by any chamber implementation having 20 percent or more of the chamber interior surface configured to provide for selective reflection. In this regard, it should be remembered that selectively reflective chamber surfaces that are at least generally parallel to and, in particular, confronting, the major surface of a treatment object, are likely to provide an enhanced response with respect to the benefits realized by the practice of the present invention. Moreover, the various embodiments described herein may be combined in any suitable manner.

Continuing to refer to FIG. 5, still another embodiment, which is essentially identical in appearance to that embodiment described immediately above, resides in using outer chamber walls 65, formed using metal, as a short wavelength reflector. In this instance, the material from which sheet members 100a-e are then formed is selected to be essentially transparent at short wavelengths, yet opaque at longer wavelengths in a way which provides an appropriate crossover wavelength. It is noted that materials that are referred to herein as transparent are understood to provide for light transmission in a contemplated wavelength range at least to an acceptable approximation. Sheet members 100 act as a filter that absorbs the long wavelength radiation, while allowing the chamber wall to carry on serving as a high reflectivity reflector for the lamp radiation. It is desirable for the sheet members to be transparent, for example, at less than approximately 2 µm and opaque at approximately greater than 2 µm in wavelength, although it is to be understood that this crossover wavelength has been selected as one possible value, that is useful and is in no way intended as being limiting in any embodiment described herein. It is noted that some glasses come at least acceptably close to this requirement, and can also exhibit the benefit of a low surface reflectivity. For example, some rare-earth doped glasses have strong absorption bands in the near infrared that could provide suitable absorption features. Even glasses such as, for example, Pyrex, that cut off most radiation for wavelengths greater than 2.5 may be suitable. Suitable rare-earth doped glasses and associated methods are described in co-pending U.S. application Ser. No. 10/288,272, filed on Nov. 5, 2002, entitled APPARATUS AND METHOD FOR REDUCING STRAY LIGHT IN SUBSTRATE PROCESSING CHAMBERS, which is commonly assigned with the present application and is hereby incorporated herein in its entirety by reference.

Figure 6:
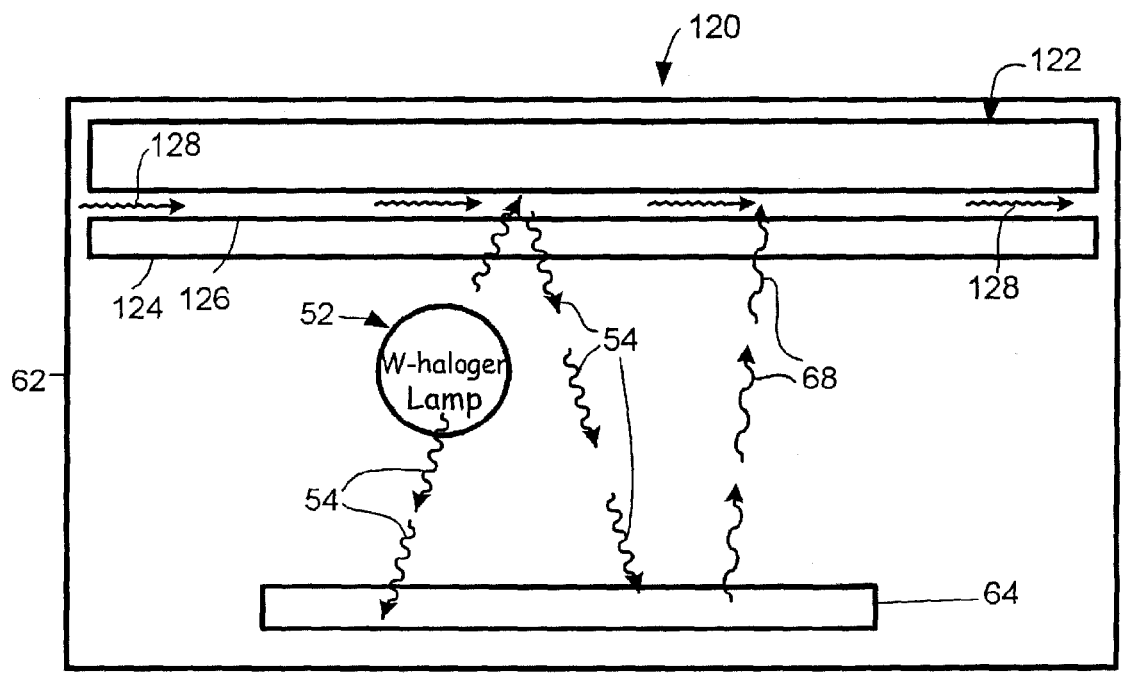
FIG. 6 is a diagrammatic cross-sectional view, in elevation, of still another treatment chamber that is produced in accordance with the present invention having a chamber wall arrangement, which includes an at least semi-transparent layer that is spaced apart from a chamber wall for receiving a flowable material therebetween.

Attention is now directed to FIG. 6 which diagrammatically illustrates a treatment system, produced in accordance with the present invention and generally indicated by the reference number 120. System 120 includes a chamber wall 122 as part of an overall chamber wall arrangement that serves to define treatment chamber 62. In the present example, only chamber wall 122 has been illustrated for purposes of clarity, although such walls are understood to be arranged in a way which surrounds the treatment chamber, as shown in previously described figures. Chamber wall 122 further serves as a reflector plate for heating arrangement 52. An at least semi-transparent layer 124 is supported in a spaced apart relationship from chamber wall 122 so as to define a void or channel 126 therebetween. While layer 124 of the present example is transparent, in some embodiments, this layer may include a degree of selective reflectivity or absorbance. Spacers (not shown) or any other suitable mechanism of the many that are known in the art may be used for maintaining this spaced apart relationship. Channel 126 receives a flow of a flowable material 128 that is indicated by a number of arrows within the channel. This flowable material may be referred to interchangeably as fluid and may advantageously serve in a heat transfer role, whereby system 120 is cooled. The flowable material may comprise a liquid or a gas, as desired.

Even more advantageously, however, flowable material 128 serves as a filtering element with respect to at least one of lamp radiation 52 and substrate emitted radiation 68. In this regard, it should be observed that heating arrangement radiant energy is illustrated as reflecting from chamber wall 122 through flowable material 128, while treatment object radiated energy 68 is illustrated as being absorbed by flowable material 128. In one feature, the fluid may include water. One advantage of this feature resides in the fact that water is a very strong absorber of infrared radiation at wavelengths greater than approximately 1.4 µm, and hence can form a useful selective reflector, in combination, for example, with any broadband reflector serving as a chamber wall. Of course, the chamber wall could additionally be lined or coated, as described above and may serve as a reflector plate, backing the heating arrangement. A lined chamber wall configuration can appear similar to the lined chamber of FIG. 5 accompanied by one or more semi-transparent layers 124 (FIG. 6) in a spaced apart relationship with the lined chamber walls. Again, it is noted that selective reflection, backing the heating arrangement (i.e., as a reflector plate), is considered to provide the greatest benefit where there may be some motivation not to cover or treat the entire interior periphery of the chamber such as, for example, system cost. In implementations having a heating arrangement below the treatment object, a significant benefit is likewise expected by using a similar water layer carrying arrangement beneath the treatment object.

In many prior art RTP systems, the treatment object faces a quartz window that isolates it from the heating lamps. It is recognized that this window itself provides a degree of spectral selectivity, since it is generally opaque for wavelengths longer than approximately 3.7 µm, and transparent at shorter wavelengths. Moreover, the window exhibits a transition region that extends from practical transparency to practical opacity. The center of the transition region may be considered as an opacity onset wavelength. Hence, the window acts as a filter, in a manner which introduces selective reflection properties, rather like the lining of the embodiment of FIG. 5. However, there is an important difference, as compared to a chamber surface, wall or lining, since the window also filters all of the heating arrangement emitted radiation which ultimately reaches the wafer. Hence, the window will significantly impact efficiency of energy transmission to the treatment object from the heating arrangement. In the instance in which the window is water cooled, relatively large energy loss is expected for at least some sources, as noted above, since water is a very strong absorber of IR energy for wavelengths greater than 1.4 µm. Accordingly, water-cooled windows are mainly expected to be useful in conjunction with shorter wavelength heat sources such as, for example, arc-lamp sources that emit most of their energy below this wavelength. With these recognized constraints now in view, it is considered that window arrangements can be implemented and used with benefit. For example, if a window is formed of a material with absorption that becomes strong at wavelengths greater than 2 µm, it is considered as likely to be useful. As an alternative to a window supporting a water layer, it is recognized that the aforementioned rare-earth doped glasses, having strong absorption bands in the near infrared, may be employed in window arrangements that are made up of one or more layers. Moreover, glasses such as, for example, Pyrex, that cut off most radiation for wavelengths greater than 2.5 µm, may be suitable.

In connection with the discussion of windows, it is appropriate at this juncture to note that some materials may not be acceptable for forming a chamber wall or coating thereof because these materials may not be as chemically stable or as pure as might be desired in directly facing the substrate and/or being resident with the substrate in a common treatment chamber, although these materials may exhibit extremely desirable characteristics.

Figure 7:
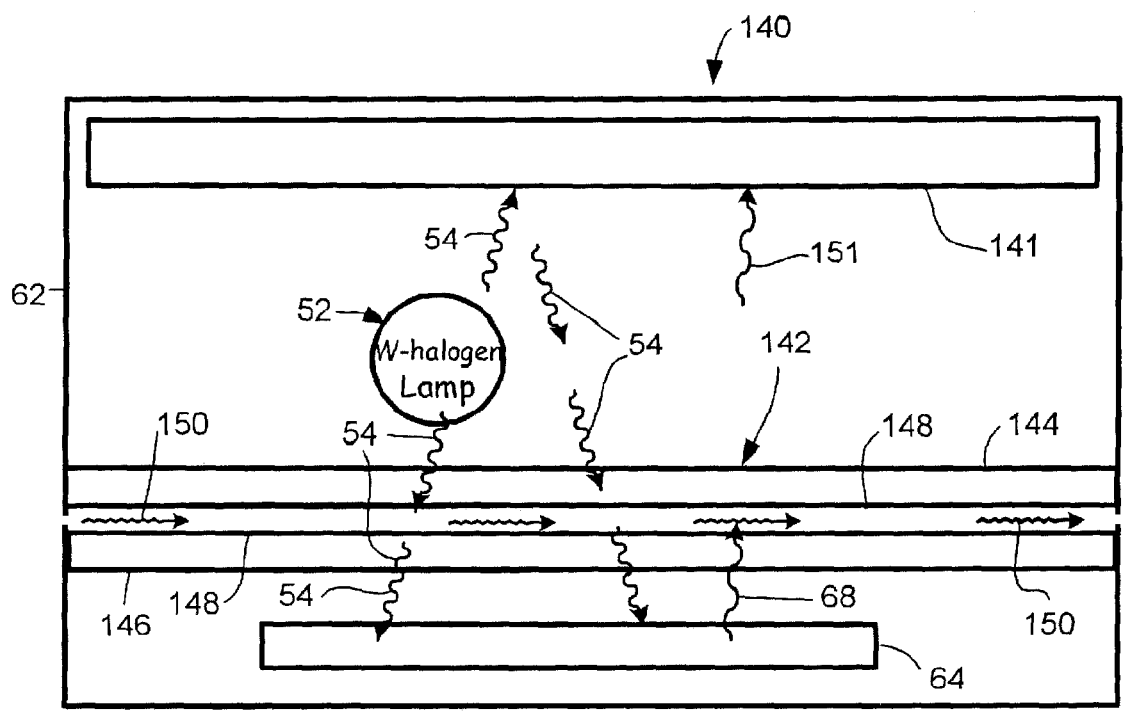
FIG. 7 is a diagrammatic cross-sectional view, in elevation, of yet another treatment chamber that is produced in accordance with the present invention having a chamber, which includes a window arrangement that is interposed between the heating arrangement and the treatment object for supporting a flowable material layer.

Turning now to FIG. 7, attention is now directed to another system, produced in accordance with the present invention and generally indicated by the reference number 140. System 140 includes a chamber wall 141 as part of an overall chamber arrangement. In the present example, only chamber wall 141 has been illustrated for purposes of clarity, although such walls are understood to be arranged in a way which form the chamber arrangement. Chamber wall 141 further serves as a reflector plate for heating arrangement 52, and may optionally include a selective reflectivity characteristic, as described above, so as to generally reflect heating arrangement radiated energy 54, while generally absorbing treatment object radiated energy. Of course, other walls may be partially or fully configured for selective reflection, in accordance with the present invention. A window arrangement 142 is interposed between heating arrangement 52 and treatment object 64. In this case, window arrangement 142 may include a double window structure wherein a filtering element 144 is positioned nearest heating arrangement 52. In one implementation, a transparent window 146 is spaced apart from filtering element 144 so as to form a passage 148 between itself and the filtering element. Passage 148 permits flow of a coolant 150, indicated using arrows, either gas or a liquid therethrough. As mentioned above, water can be used as the coolant, depending, for example, upon the wavelength characteristics of the heating arrangement. Further discussions of suitable fluid characteristics are given at an appropriate point below. It should be observed that heating arrangement radiant energy 54, in addition to reflecting from selective reflecting wall 141, is illustrated as passing through window arrangement 142, while treatment object radiated energy 68 is illustrated as being absorbed by flowable material 150. The overall response of the window arrangement, like any window arrangement described herein, may be characterized as decreasing transmissivity with increasing wavelength. Further, any energy 151, generally within the wavelength range that encompasses the treatment object radiated energy, and which reaches wall 141, will generally be absorbed by wall 141 in serving as a reflector plate although this is an optional configuration, not a requirement. It is noted that energy 151 could arise, for example, as a small portion of the heat source radiated energy, a portion of treatment object radiated energy which escapes absorption in window arrangement 142 and/or a portion of energy that is radiated by a window arrangement, such as window arrangement 142, upon being heated. It is to be understood that a single plate member may be employed as a window arrangement, while the teachings herein are applied. Further, with respect to any embodiment described herein, it is to be understood that an additional heating arrangement may be positioned below the treatment object, which may employ an additional window arrangement supported between the additional heating arrangement and the treatment object, which has not been shown for purposes of clarity.

In another implementation, which is readily visualized in view of FIG. 7, filter element 144 is moved into direct contact with transparent window 146 so as to eliminate passage 148, at least from a practical standpoint. The function of the transparent window is to serve as a protective barrier to prevent any component of the filtering layer from potentially contaminating the substrate. That is, the filtering element is not in contact with the substrate-processing environment of the treatment chamber. Heat transfer between transparent window 146 and filter element 144 may occur mainly by conduction, either through a gas or a layer of transparent cement which can be used for attachment purposes.

The transparent window in either of the foregoing implementations may be formed, for example, from fused quartz. With respect to filter element 144, any suitable material or combination of materials may be used in these implementations, or any embodiment disclosed in this overall disclosure, with no limitation to the specific materials described herein which exhibit selective reflectivity.

Figure 8:
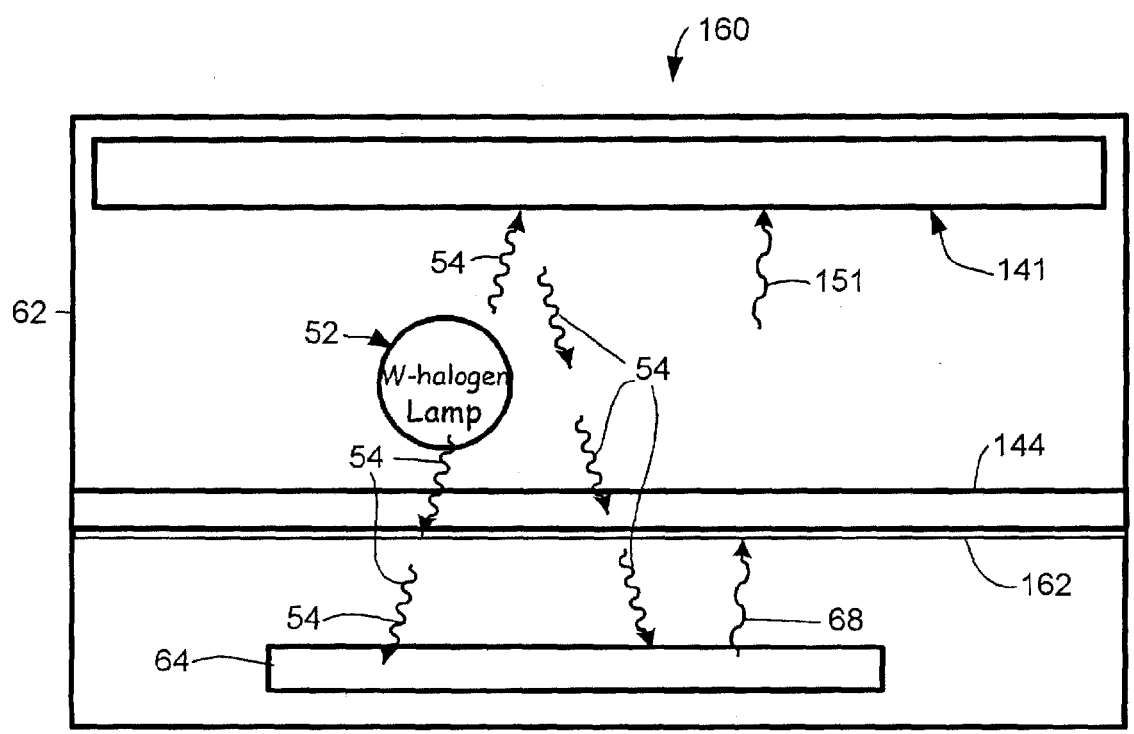
FIG. 8 is a diagrammatic cross-sectional view, in elevation, of another treatment chamber that is produced in accordance with the present invention having a chamber, which includes a window that is interposed between the heating arrangement and the treatment object having a coating, which serves to isolate a filtering layer from the treatment object in order to avoid contamination.

Referring to FIG. 8, in still another embodiment of the present invention, generally indicated by the reference number 160, filtering element 144 may receive a coating which serves as a protective/transparent layer 162 that is functionally equivalent to transparent window 146. There are a number of materials that could be used as a protective/transparent layer including, but not limited to $SiO_2$, $Al_2O_3$ and YAG. The protective layer can be applied to filter layer 144 by any number of suitable techniques such as, for example, evaporation, sputtering, ion plating and dip coating. It is to be understood that any window arrangement described herein can be used, as an option, with any selective reflectivity wall arrangement disclosed herein.

In connection with FIGS. 6 and 7, there can be advantages to using deuterium oxide ($D_2O$, heavy water) rather than normal water. $D_2O$ has an infrared absorption spectrum that includes features similar to the $H_2O$ absorption spectrum, except that they are shifted to longer wavelengths. This moves the strong absorption cut-off to wavelengths greater than approximately 2.0 µm. Accordingly, such an implementation is considered to be advantageous due to an attendant reduction in the absorption of lamp radiation. Further, the use of the species HDO, deuterated water, is contemplated having an absorption spectrum that lies between that of $H_2O$ and that of $D_2O$. As noted above, $H_2O$ may not be ideal, for example, as a window cooling fluid when the energy source is an array of W-halogen lamps. $D_2O$, however, can be used in this application with far less energy loss.

It is further noted that any absorbing system that relies on absorption arising from bonds to hydrogen can be modified by deuteration, so that the bonds to hydrogen are replaced by bonds to deuterium. As non-limiting examples, the absorption spectrum of silica glass could be altered through the introduction of O-D bonds rather than OH bonds and organic materials containing C—H bonds could be altered to C-D bonds.

Having described the wavelength response of a quartz window above, it is important to understand that the selective reflective surface chamber configuration of the present invention will also absorb heat that would otherwise heat the quartz window that normally separates the tungsten lamps from the wafer process environment. That is, the amount of radiation which attempts to pass through the window, at wavelengths that will be absorbed, is reduced. As another effect, the selective reflector surface configuration can absorb thermal radiation that is emitted by a window itself (for a quartz window this is mainly at wavelengths greater than approximately 3.7 µm, i.e. in the region where the window is generally opaque and does not transmit lamp or wafer radiation). In this case, radiation emitted by the window, after it has been heated, is not re-reflected back onto the window by the chamber wall, leading to a lower window temperature. It is important to note that for a selective reflector to function solely in this manner does not require a crossover in reflection/absorption behavior at 2 um, since one wavelength for effective window cooling action is defined, at least approximately, by the opacity onset wavelength, e.g. typically at approximately greater than 3.7 µm for quartz windows. Accordingly, a crossover wavelength for a selective reflector, used in this manner, may be selected as any suitable wavelength chosen in relation to the opacity transition region of the window. As an example, higher or lower figures with respect to the opacity transition region of the window are considered useful so long as the function of the selective reflector is consistent with the teachings herein for purposes of window cooling. Of course, the two benefits of improved wafer cooling and improved window cooling can be combined as taught herein, but that is not a necessity for either benefit to be employed independently.

In view of the foregoing, the use of a selective reflector configuration is highly advantageous with respect to reducing the magnitude of the temperature change a window such as, for example, a quartz window, experiences as consecutive wafers are processed. In and by itself, the progressive increase in the temperature of the window results in inconsistent processing results. The present invention reduces the magnitude of the window temperature change, thereby reducing the "first wafer effects" and improving process uniformity during a period of time over which the window is heating up. At the same time, the effect of the window on wafer temperature uniformity is reduced so as to provide higher uniformity in wafer temperature. That is, the temperature differential laterally across the window width is reduced. Benefits of improved window cooling include: (a) less first wafer effects, (b) improved wafer uniformity as a result of less re-radiation of heat from a cooler window, and (c) more rapid cooling of the wafer, because less heat is transferred back to the wafer (by any of radiation, conduction & convection) as a result of the presence of a relatively cooler window. The latter point is especially relevant when the wafer has cooled down to a temperature relatively near the window temperature although some benefit is provided, as well, at high temperature.

Referring again to FIG. 2, another class of coatings that can be used to create selective reflectors are those formed from single or multilayer thin-film coatings. Accordingly, inner layer 66 may include a thin film coating arrangement, which may cooperate with wall arrangement 65 to provide a desired overall response. Thin-film coatings are designed according to optical principles that allow design for maximization or minimization of reflectivity at a selected wavelength, selected wavelengths or over a wavelength band and are frequently used in optical filtering applications. It should be appreciated that such coatings can be formed as thin as 1 nm. Accordingly, wall arrangement 65 is configured, in such an embodiment, to absorb at least the wavelengths that are not reflected. Multilayer thin-film stacks can be created as desired, based on specified objectives such as decreasing reflectivity with increasing wavelength, and are usually formed by methods of physical vapor deposition or chemical vapor deposition. In accordance with the present invention, it is considered that one having ordinary skill in the art can tailor a design, in view of this overall disclosure, to achieve high reflectivity at wavelengths below a desired cross-over wavelength and low reflectivity at wavelengths above the desired cross-over wavelength. Thin-film coatings can be applied to most materials including metal surfaces, windows, and other parts in the processing equipment, as desired. Such coatings are often used in the construction of a "cold mirror." The latter is a coating component that is sometimes used for isolating heat in projection systems. Such exemplary coatings have the characteristic of reflecting visible light while transmitting and/or absorbing infrared energy. The present invention, however, requires a crossover wavelength in the IR, rather than at the edge of the visible spectrum. That is, a modified form of a cold mirror can be used in combination with an underlying, absorbing surface such that that energy is not reflected back through the mirror.

Figure 9:
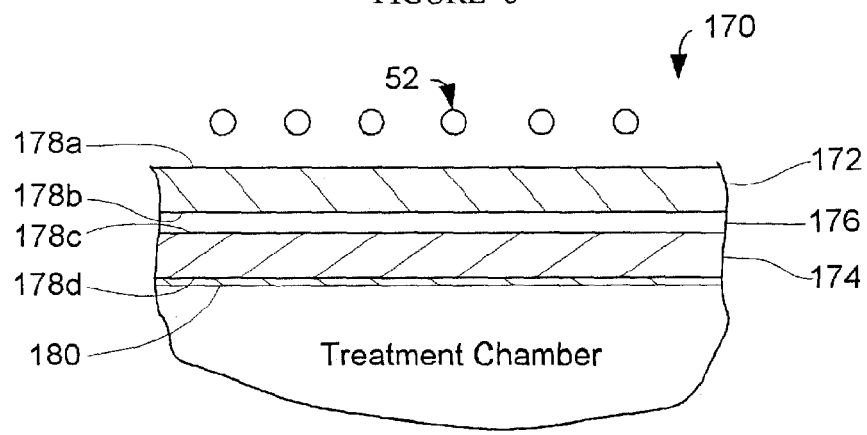
FIG. 9 is a diagrammatic, partial cross-sectional view of a dual layer window arrangement, shown here to illustrate the use of thin-film stacks.

It is to be understood that thin-film stacks may be used in a window arrangement with a considerable degree of flexibility. To that end, FIG. 9 illustrates a portion of a dual layer window arrangement, in cross-section, generally indicated by the reference number 170, having the window arrangement between heating arrangement 52 and the treatment object (not shown) in the treatment chamber. Window arrangement 170 includes a first window layer 172 and a second window layer 174. A passage 176 may be defined between these window layers, as desired, and could support a flowable material (not shown). Accordingly, window arrangement 170 defines four window surfaces that are designated by the reference numbers 178a-d. It is to be understood that at least any selected one of these surfaces can support a thin-film stack. In the present example, a thin-film stack 180 is supported by window surface 178d.

Figure 10:
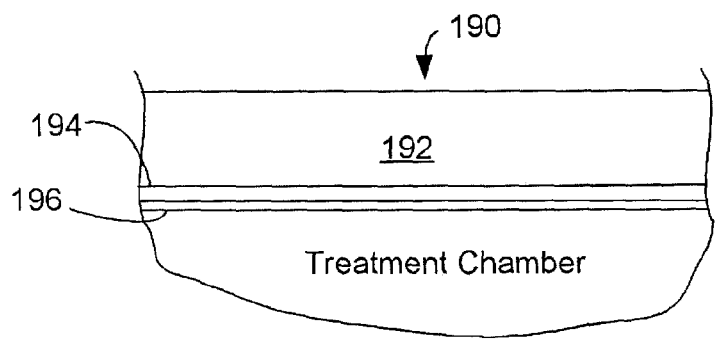
FIG. 10 is a diagrammatic cut-away view, in elevation, of a portion of a chamber wall arrangement, produced in accordance with the present invention, having an outer wall that is coated with first and second layers, which cooperate to provide a desired crossover wavelength.

Referring to FIG. 10 and again considering the subject of reflectivity response tuning, attention is directed to a section 190 of a chamber wall that is produced in accordance with the present invention. Wall section 190 includes an outer structural wall member 192 formed, for example, from aluminum. It is important to understand that layers can be applied to wall member 172 in way which controls the infrared absorption band edge so as to be able to "tune" the selective reflectivity. In this sense, "tuning" refers to an ability to shift the infrared absorption band edge of a selective reflective wall configuration to either longer or shorter wavelengths.

The foregoing can be accomplished by a first appropriate layer 194 that exhibits a selective reflective optical response when applied to the chamber surface, where it is desired to create a selective reflective surface. For purposes of the present example, it is assumed that the band edge produced by layer 194 is at a longer wavelength than is desired. In accordance with the present invention, however, first layer 194 can be over-coated with a second layer 196, using a material that is different from that which first layer 194 is formed and having an infrared absorption band edge at a shorter wavelength. By appropriately selecting a thickness for second layer 196, a shifted absorption band edge is obtained resulting from the cooperation of the first and second layers. That is, an overall absorption band edge is provided having a wavelength that is between the "intrinsic" wavelengths that are contributed by the first and second layers, when considered individually. Accordingly, second layer 196 should be semitransparent in the shorter wavelength region (below the desired crossover wavelength) and absorptive in the longer wavelength region (above the desired crossover wavelength). It should be appreciated that this implementation should not be thought of in terms of being a thin-film effect, but as a combined response that arises from the bulk properties of the different layers. The combined response of the first two layers may be thought of as that of a single layer for purposes of adding a third layer.

Having described the advantages of the present invention in detail above, as well as a number of system embodiments, it is appropriate to now provide more specific details with respect to predicted benefits that are attendant to its use in the context of a USJ (Ultra Shallow Junction) Spike Anneal process for a 300 mm semiconductor wafer.

Figure 11:
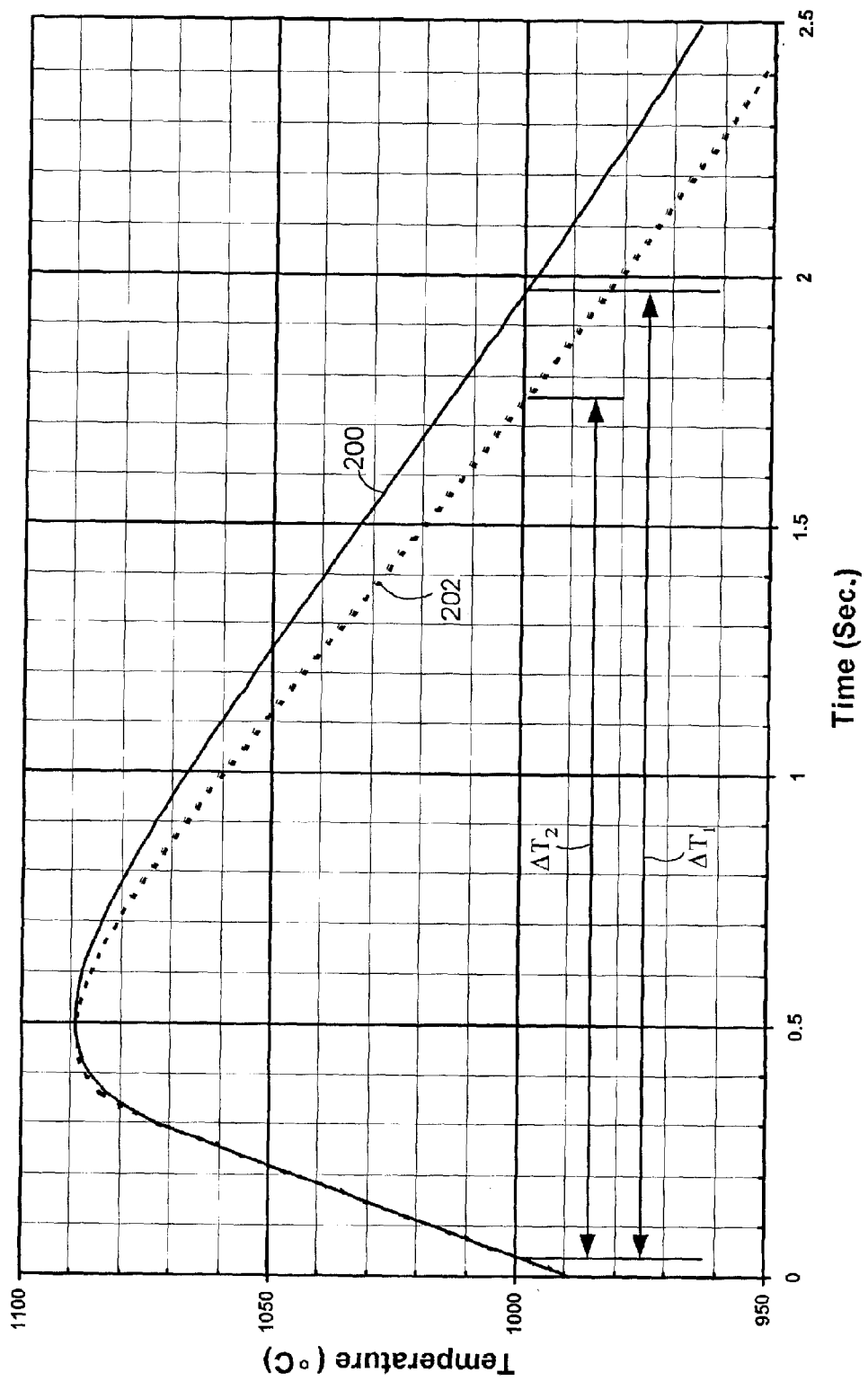
FIG. 11 is a plot of temperature versus time, shown here for purposes of comparing predicted results in the form of the peak width of an anneal process performed in an unmodified chamber with the peak width for the same process as performed in a modified chamber in which the lamp reflector plate is configured for selective reflectivity.

FIG. 11 shows first and second temperature USJ anneal profiles, 200 and 202, respectively, of temperature plotted against time. The results of FIG. 11 were obtained using a set of equations in a computer model that represent the wafer temperature response during the USJ "spike" process. The model was developed assuming that the wafer is heated at a constant rate when illuminated by heating arrangements both above and below the wafer (i.e., Tungsten-Halogen lamps). Also, it is assumed that the wafer-cooling rate is a function of the residual heat from the energy source, when the energy source is turned off (i.e. when electrical power to the lamps is terminated) and that the lamps store residual energy in their hot filaments and a smaller amount of energy is stored in and radiates from the quartz lamp envelopes. Heat loss is assumed through radiation and convection from the wafer surface. The heat loss by radiation from the wafer surface, during the cooling period, is a function of surface reflectivity of the chamber cavity. For these predictions, it is assumed that the lamp reflector plates represent the majority of relevant chamber surface area). Hence, the present example considers that selective reflectivity is applied only to the lamp reflector surfaces.

Still referring to FIG. 11, first temperature profile 170 illustrates a prior art temperature profile, shown as a dashed line, and obtained using the aforedescribed model for a standard RTP system using Tungsten-halogen lamps with interior treatment chamber walls formed from polished aluminum. Second temperature profile 202 considers an identical treatment chamber and wafer, except that the lamp reflector surfaces, in this case only the surface behind the lamps with respect to the wafer, are coated with diffuse aluminum oxide. For first profile 200, a peak width $\Delta T_1$ is shown for a temperature drop of 100 degrees C. having a time duration of approximately 1.93 seconds. For second profile 202, with the same temperature drop of 100 degrees C., however, the corresponding peak width $\Delta T_2$ is only approximately 1.71 seconds. Remarkably, an improvement of approximately 11.3% is demonstrated. Cool-down of the wafer is dramatically enhanced, with the cool-down period itself being shortened by approximately 15%.

Turning now to a discussion of the use of radiation pyrometry, in view of the introductory discussion in the Background section of the present application, a possible contradiction of requirements can arise when it is desired to provide a highly reflective surface for purposes of increasing the effective emissivity of a treatment object such as, for example, a semiconductor wafer. In this regard, it may be desirable to provide a chamber that is highly reflecting at the pyrometer wavelength. This desire may be at odds, however, with a desire to make the chamber highly absorbing for most of the thermal radiation emitted by the wafer.

Figure 12:
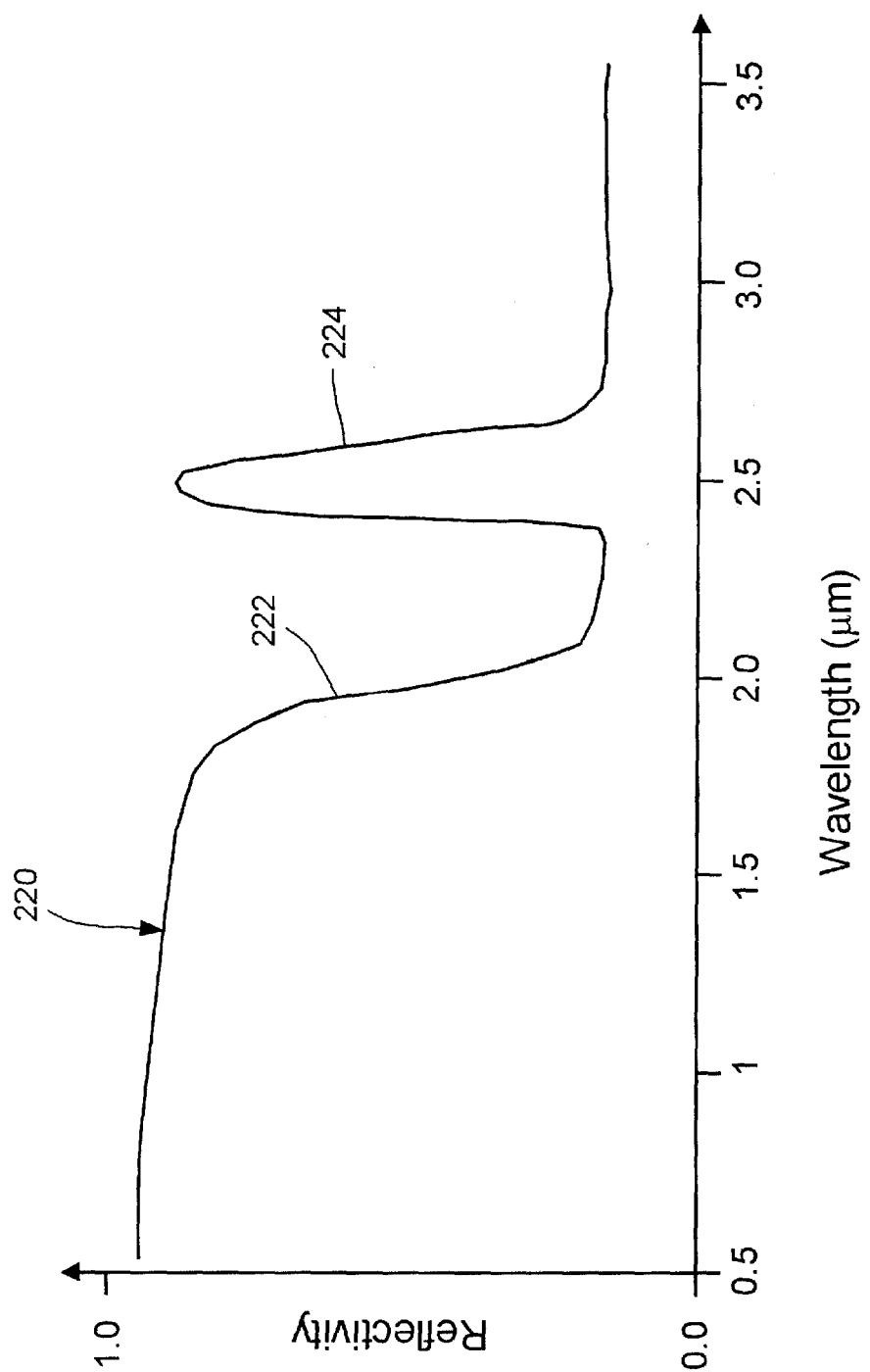
FIG. 12 is a plot of an idealized spectral response of a selective reflective coating or material for use in optimizing pyrometry while, at the same time, providing enhanced system performance with respect to wafer heating and cooling.

Referring to FIG. 12, the present invention resolves these competing desires in a highly advantageous way through the use of a chamber interior with a reflection spectrum that exhibits a high reflectivity at the pyrometer wavelength, while the interior exhibits a low total reflectivity for the thermal radiation spectrum of the wafer. To that end, FIG. 12 illustrates a plot of an idealized spectral response 220 of a selective reflective coating or material which provides the appropriate characteristics. Such a coating can be constructed in any suitable way such as, for example, by design of a multi-layer thin film stack. As mentioned above, such thin film stacks are producible by one of ordinary skill in the art in view of a particular reflectance spectrum that is desired. Moreover, selection or fabrication of a bulk material is contemplated that exhibits a reflectivity maximum at the pyrometer wavelength, but otherwise has a low total reflectivity. Any material which provides a suitable spectral response, either currently available or yet to be developed, is contemplated for use herein. Response 220 includes a general drop 222 in reflectivity at approximately 2 μm. A reflectivity peak 224 is centered at the pyrometer wavelength to reflect radiation in a narrow wavelength band that is, at least approximately, centered on the pyrometer wavelength. As a note, it should be appreciated that a spectral response without the presence of peak 224 represents the idealized reflectivity spectrum of a material that is suited for enhancing wafer cooling while still providing a high reflectivity for efficient lamp heating (see also FIG. 3).

The selection of the specific measurement wavelength used for pyrometry can be at least partly based on the availability of a suitable material or thin-film stack. While the term "pyrometer wavelength" is used herein as if the pyrometer is responsive at only one wavelength, it is to be understood this term refers to the center of a relatively narrow wavelength band over which the pyrometer is responsive.

Figure 13:
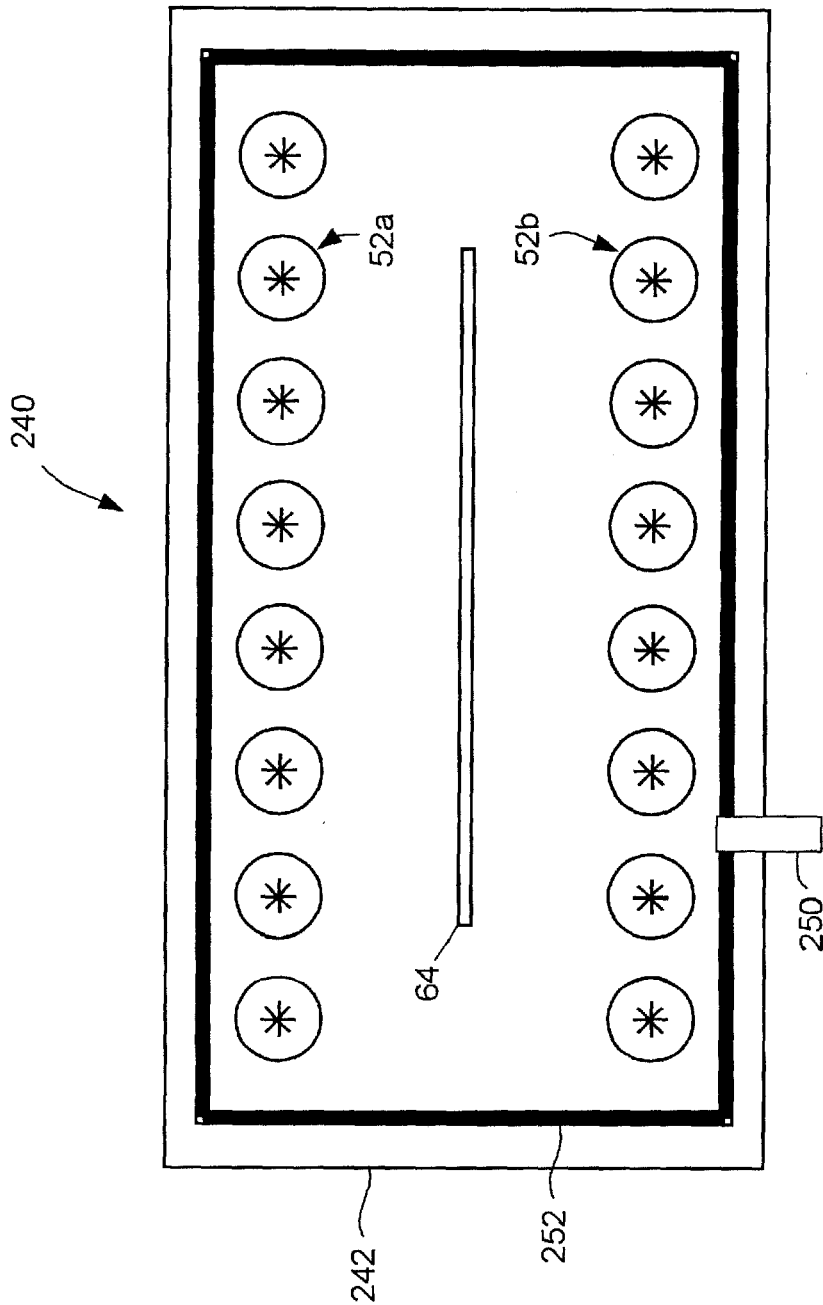
FIG. 13 is diagrammatic view, in elevation, of a system, having upper and lower lamp arrays, which uses the spectral response shown in FIG. 12.

Referring to FIG. 13 in conjunction with FIG. 12, the former diagrammatically illustrates a system 240 having a treatment chamber 242 with upper and lower lamp arrays 52*a* and 52*b*, respectively, positioned therein for illuminating opposing surfaces of a treatment object 64 such as, for example, semiconductor wafer 64. A pyrometer or a set of pyrometer light collection optics 250 is provided with a view of the wafer through the chamber wall and between adjacent ones of the lamps for sensing the wafer temperature. While only one pyrometer arrangement is illustrated in the present example, for purposes of simplicity, any suitable number may be employed viewing either or both sides of the wafer, as will be further described. Further, a selective reflectivity interior 252 has been provided in chamber 242 which implements the spectral response that is illustrated by FIG. 12. In this way, reflectance of the chamber interior is high at the pyrometer wavelength while providing the advantages described above with respect to wafer heating and cooling characteristics.

In view of FIG. 12, the present invention has provided a highly advantageous and heretofore unseen customized spectral response or spectral response system which is tailored or customized to wafer heating, wafer cooling and enhanced temperature measurement. It is contemplated that additional factors relevant to chamber performance may be accounted for in this overall spectral response system, resulting in heretofore unavailable benefits. For example, as will be further described, the chamber response may be customized to attenuate stray light which might enter the pyrometer(s). It is to be understood that the chamber arrangement of FIG. 13, like all other chamber arrangements described herein, may be customized in any suitable manner, as will be further described.

The present invention recognizes a general principle wherein the chamber reflection spectrum is designed to simultaneously optimize the heating and/or cooling performance in conjunction with the pyrometer accuracy. In this regard, there may also be advantages in some pyrometry schemes with respect to making the chamber (or parts of the chamber) highly absorbing at the pyrometer wavelength. As one example, the distribution of stray light from the heating arrangement lamps can be controlled within the chamber such that the stray light has minimal impact on pyrometer readings. In order to achieve this, a low reflectivity at the pyrometer wavelength may be provided, either across the whole of the chamber, or limited to portions of the chamber walls that tend to guide light from the heating lamps into optical paths that lead into the pyrometer optics. This recognition, in and by itself, to design the chamber walls in a way which attenuates those stray light paths, may be proven as a powerful concept for future chamber design that stands on its own, aside from other highly advantageous recognitions brought to light by the present invention such as, for example, enhanced cooling. Control of stray light is of concern at least for the reason that there is an ongoing concern with wafer temperature measurement, which is usually affected by reflector design. Accordingly, a spectrally selective coating that allows separate, customized optimization of heating/cooling performance (for example, heating rate and cooling rate), and uniformity, as well as pyrometer design, is considered to provide sweeping improvements over the prior art, standing on its own merits. At the same time, this recognition is considered to provide remarkable improvements in combination with other highly advantageous concepts taught herein.

Figure 14:
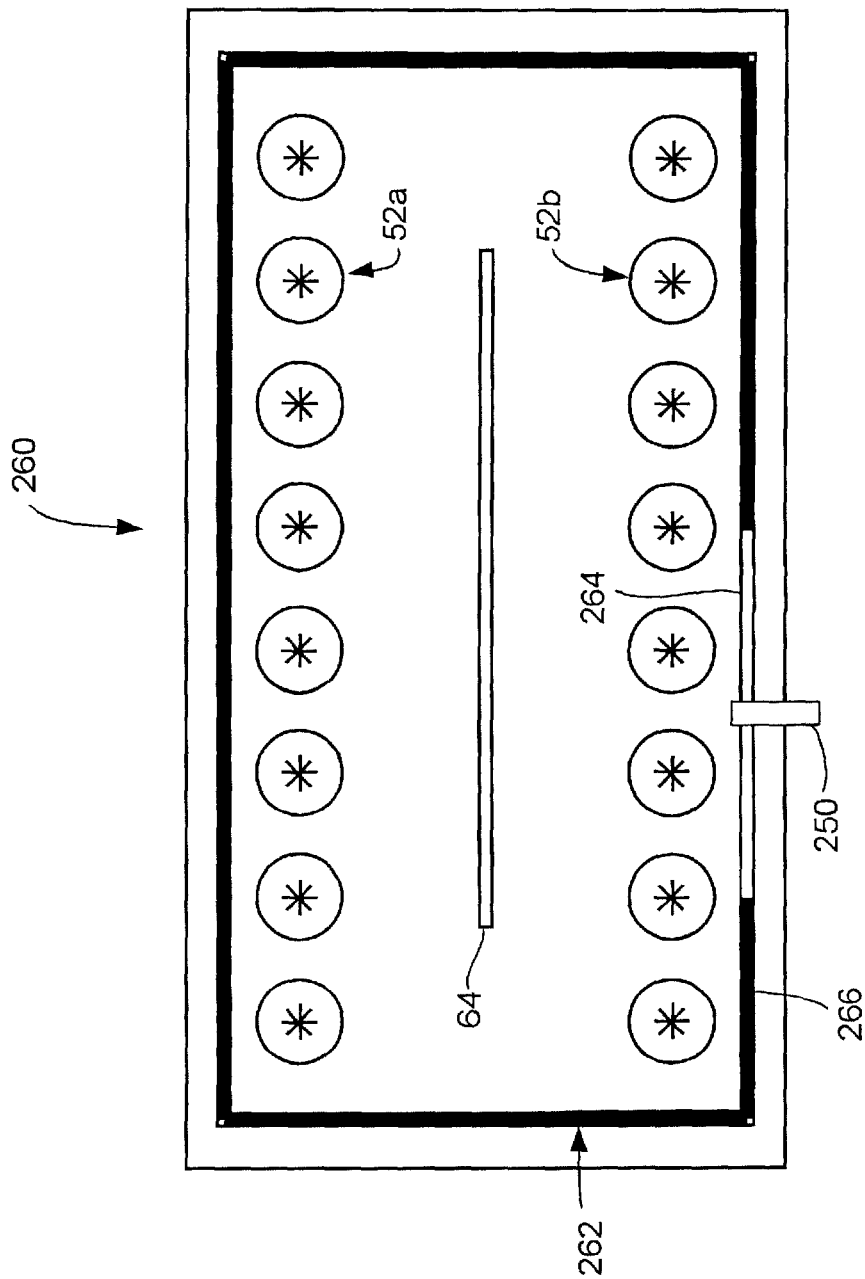
FIG. 14 is a diagrammatic view, in elevation, of another system, having upper and lower lamp arrays, which uses a highly reflective area proximate to a pyrometer but which otherwise uses a selective reflective chamber interior.
Figure 15:
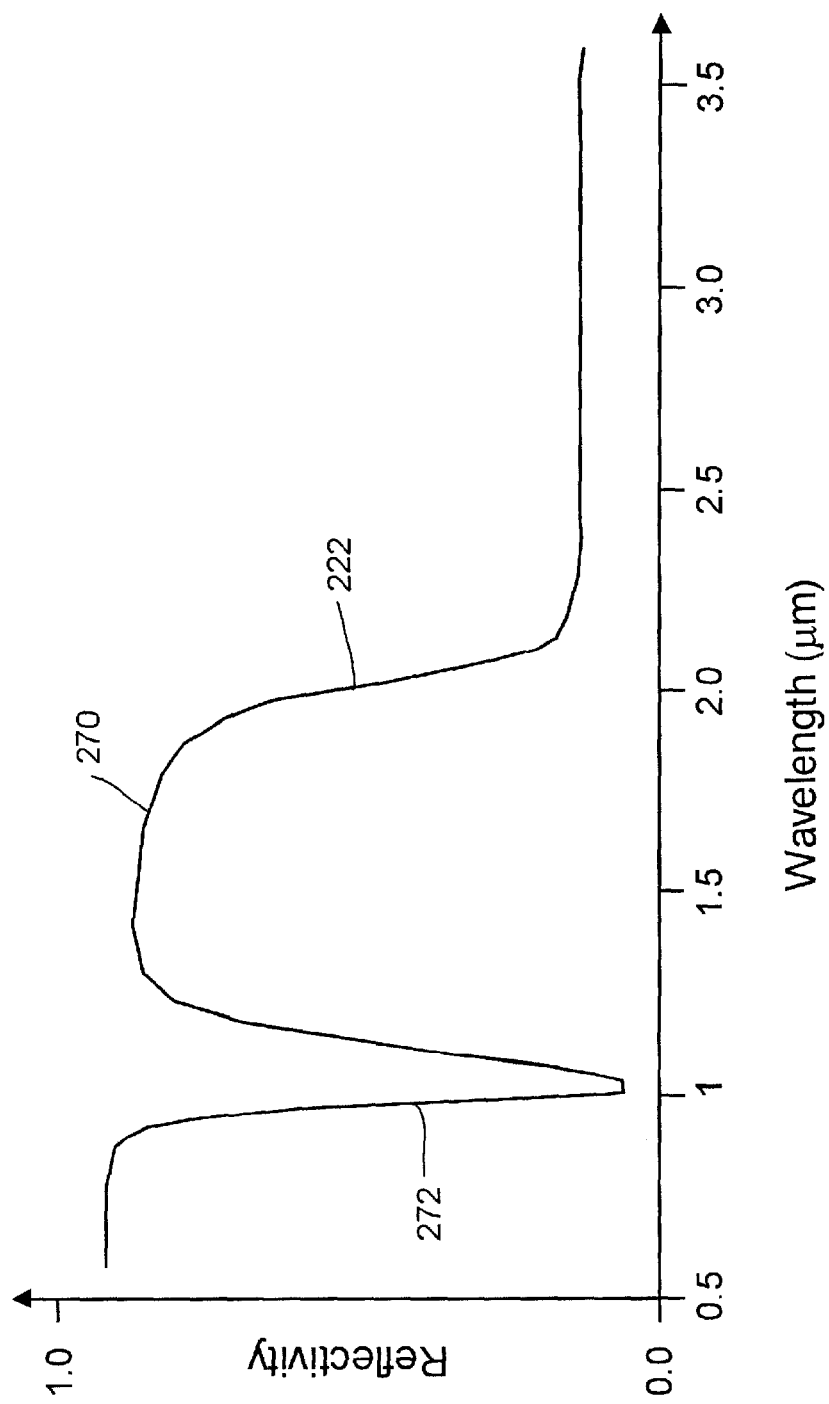
FIG. 15 is a plot of an idealized spectral response of a selective reflective coating or material for use in optimizing pyrometry by reducing stray light entering the pyrometer while, at the same time, providing enhanced system performance with respect to wafer heating and cooling.

Attention is now directed to FIG. 14 which diagrammatically illustrates another possible solution for optimizing pyrometer response in a system embodiment that is generally indicated by the reference number 260. In particular, a chamber wall surface arrangement 262 provides for high reflectivity only locally in a region 264 around the pyrometer aperture itself. The chamber may otherwise provide a selective reflective interior 266, indicated by a heavy line. In this way, a majority of the properties of the chamber wall can be preserved, in particular, with respect to providing enhanced wafer cooling. It is noted that interior 266 may be optimized for the pyrometer by having a low reflectivity at the pyrometer wavelength for purposes of suppressing stray light such as is conceptually understood with reference to FIG. 15, yet to be described. In order to avoid excessive cooling non-uniformity in the wafer, however, region 264, with high reflectivity, should be quite small and/or the wafer should be rotated, such that any non-uniformity produced by this region is swept across the wafer surface, so as to azimuthally average out any local temperature non-uniformity arising from the chamber non-uniformity. One criterion, well known to those of skill in the art. for insuring that region 264 is sufficiently large, around the pyrometer aperture for significant emissivity enhancement, is based on the distance between the pyrometry aperture and the wafer, as well as the angular acceptance range of the pyrometer optics. One more straightforward approach suggests that the region of high reflectivity should have a radius of at least 0.25 times the distance between the aperture and the wafer. This conflicts with the uniformity requirement of keeping the region small, thus emphasizing the benefit of a spectrally selective approach, as taught by the present invention. In an alternative implementation, region 264 can be highly absorbing, rather than highly reflecting. Such an implementation can be useful for a pyrometer wherein a different emissivity correction scheme is utilized. Such a high absorption implementation may then be employed for attenuating stray light incident on the absorbing surface, especially with respect, but not limited to stray light originating from the lamps near the pyrometer input optics. FIG. 15 is a plot of an idealized spectral response 270 of selective reflective interior 266 of FIG. 14, assuming a pyrometer wavelength of 1 µm. Response 270 includes general drop 222 in reflectivity, as well as a reflectivity trough 272 at a wavelength of 1 µm for use in suppression of stray radiation in the pyrometer band centered at 1 µm. Comparison of FIG. 15 with FIG. 12 is instructive with respect to understanding that the location of pyrometer response band is selectable. Moreover, depending upon the immediate objectives, it may be desirable to suppress the pyrometer wavelength or to reflect it. In some embodiments, one portion of the of the chamber may selectively reflect the pyrometer wavelength while another portion of the chamber may selectively absorb the pyrometer wavelength. For example, region 264 of FIG. 14 may be configured to selectively reflect only the pyrometer wavelength while region 266 responds according to FIG. 15. In an alternative implementation, the spectral response of FIG. 15 can be used for interior 252 of the system arrangement of FIG. 13, for example, in the case where the pyrometer is more disturbed by stray light than by emissivity issues. Moreover, the spectral response of FIG. 15 can also be useful in system 260 of FIG. 14, wherein it is desired that region 264 attenuate stray light when emissivity has otherwise been addressed. With regard to all of these various examples, it is important to realize that any number of alternative, customized responses may be formulated, based on design concerns which can arise in a particular setting. For example, in one setting it may be desirable for a selected region to be absorbing or selectively absorbing while in another setting it may be desirable for that very same region to be reflecting or selectively reflecting. In view of the teachings herein, it is submitted that the present invention provides a highly flexible set of design concepts which may be used to overcome a wide array of design objectives faced by those having ordinary skill in the art for purposes of customizing chamber response.

Figure 16:
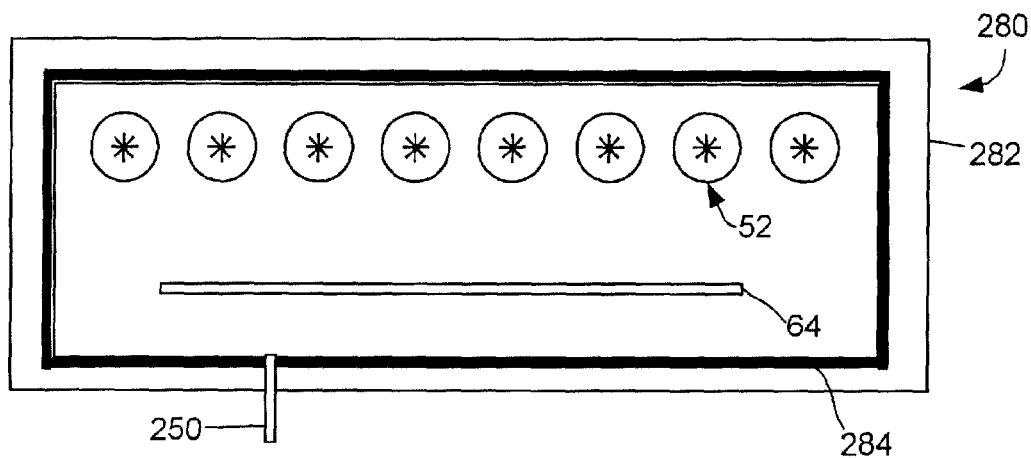
FIG. 16 is a diagrammatic view, in elevation, of a system, having single side wafer heating, which uses a selective reflective chamber interior.

FIG. 16 diagrammatically illustrates a system 280 having single-sided wafer heating using heating arrangement 52 within a chamber 282. A chamber interior 284 is treated uniformly to provide selective reflection throughout the chamber. Pyrometer 250 or its optics are arranged to view a lower surface of wafer 64. The reflection spectrum of interior 284 may be optimized for pyrometer 250. Again, depending on the pyrometer details, there may be benefits to having either a high or a low reflectivity at the pyrometer wavelength.

Figure 17:
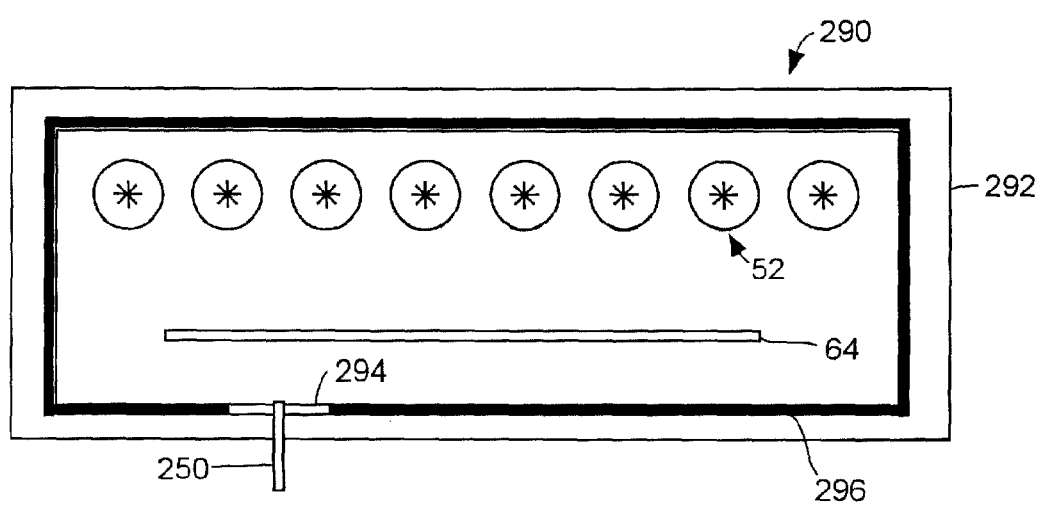
FIG. 17 is a diagrammatic view, in elevation, of another system, having single side heating, which uses a highly reflective area proximate to a pyrometer but which otherwise may use a selective reflective chamber interior.

FIG. 17 diagrammatically illustrates a system 290 having single-sided wafer heating using heating arrangement 52 within a chamber 292 optimized for pyrometry. One portion 294 of the chamber around the pyrometer is selectively reflective to optimize pyrometer performance. Another portion 296 of the chamber interior, indicated by a thick, solid line, is spaced away from the pyrometer optics so that its reflection spectrum is not necessarily optimized for the pyrometer. However, portion 296 may nonetheless be optimized, for example, to have a low reflectivity at the pyrometer wavelength for better suppression of stray light (see FIG. 15). It is noted that portion 294, surrounding the pyrometer may be configured in any suitable manner that is different from portion 296, in view of the design circumstances encountered, a number of possible ones of which are outlined above.

Figure 18:
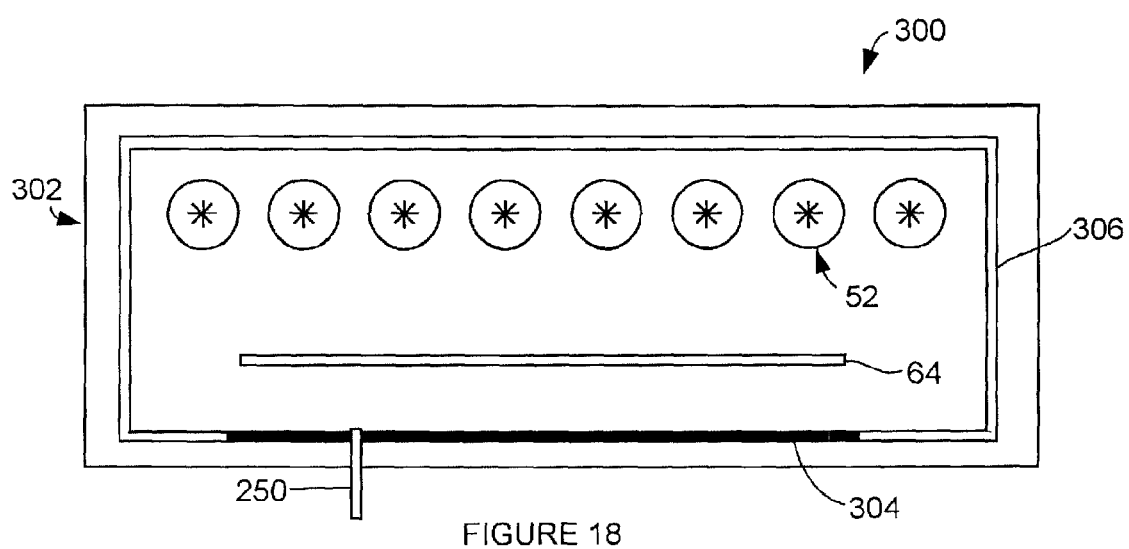
FIG. 18 is a diagrammatic view, in elevation, of still another system, having single side heating, which uses a selective reflective treatment of the chamber bottom that is designed to optimize pyrometery results.

FIG. 18 diagrammatically illustrates a system 300 having single-sided wafer heating using heating arrangement 52 within a chamber 302. In this example, a selective reflector coating 304, indicated using a thick, solid line, is designed to optimize pyrometer performance for the single-sided heating chamber. In particular, the selective reflectivity is not excluded from the region around the pyrometer optics, so its reflection spectrum may be optimized for the pyrometer, for example, by maintaining a high reflectivity at the pyrometer wavelength. In this situation, the coating could be absorbing at all wavelengths apart from the pyrometer wavelength, as will be illustrated. It is noted that a portion of the bottom surface of the chamber which confronts the wafer has been treated with coating 304 in the present example. As a result of the presence of coating 304, it should be appreciated that a uniform processing result is likely. Remaining portions 306 of the chamber interior, indicated using a double line, may be treated for purposes of efficiently reflecting lamp radiation. Alternatively, coating 304 may configured for stray light suppression depending, for example, on pyrometry concerns with respect thereto. Of course, selective reflectivity may be employed, consistent with the descriptions above. In one implementation, portions 306 of the chamber may be treated with selective reflectivity to enhance wafer heating/cooling performance. In another implementation, portions 306 may be treated to absorb the pyrometer wavelength as is illustrated by reflectivity trough 272 of FIG. 15. Moreover, these implementations may be combined such that portions 306 respond in a manner that is consistent with FIG. 15.

Figure 19:
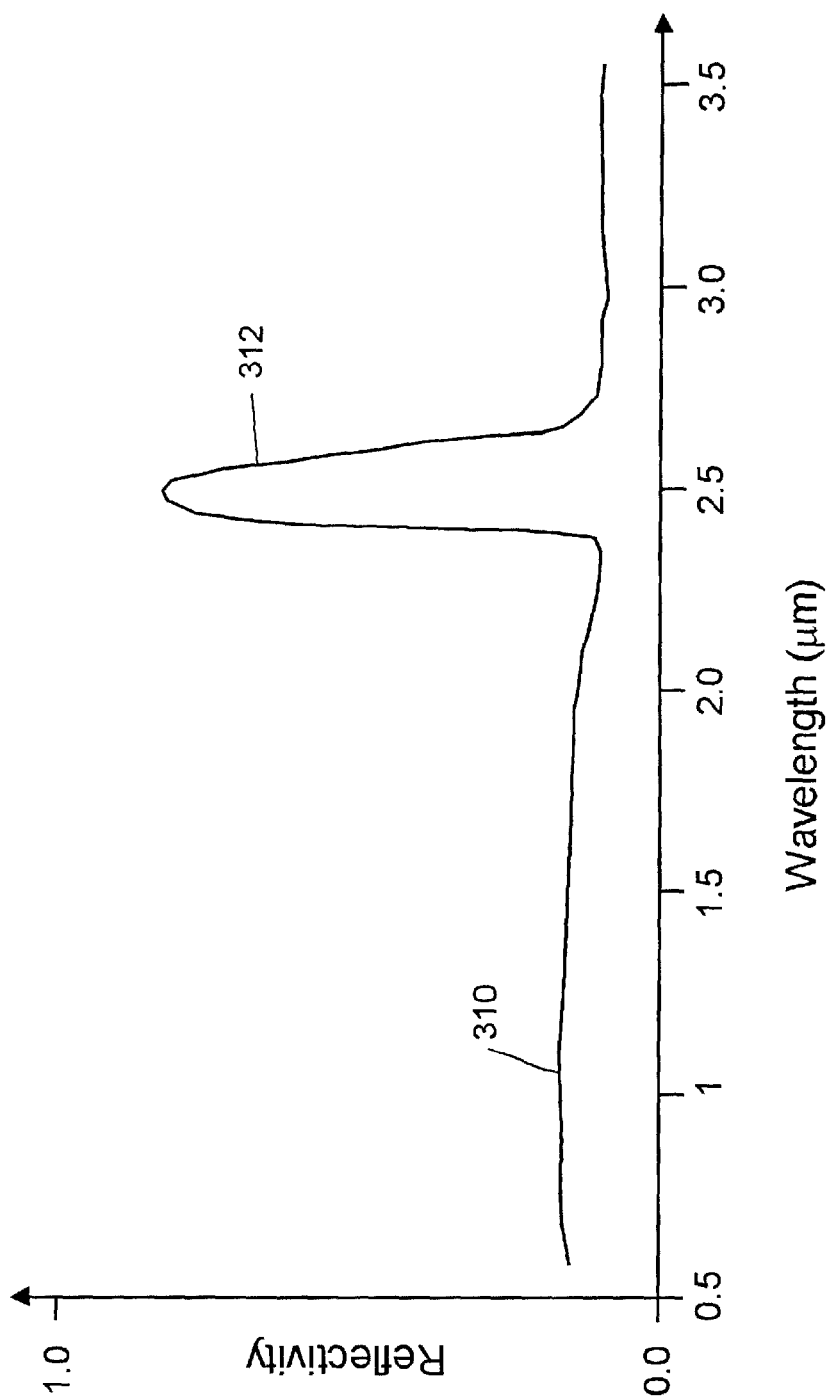
FIG. 19 is a wavelength plot of an idealized spectral response of a selective reflective coating that is suitable for treating the chamber bottom of the system shown in FIG. 18, which enhances emissivity at the pyrometer wavelength.

Attention is now directed to FIG. 19 in conjunction with FIG. 18. The former is a plot of an idealized spectral response 310 of selective reflective coating 304, assuming a pyrometer wavelength of 2.5 µm. Response 310 includes a reflectivity peak 312 in a narrow wavelength band centered at approximately 2.5 µm such that all other wavelengths are attenuated in relation to the pyrometer wavelength. This approach is considered to be useful in a single-sided heating system for the enhancement of effective emissivity at that wavelength. The coating can be limited to the reflector that is beneath the wafer. Since there are no lamps located below the wafer, the short-wavelength reflectivity need not be high.

Figure 20:
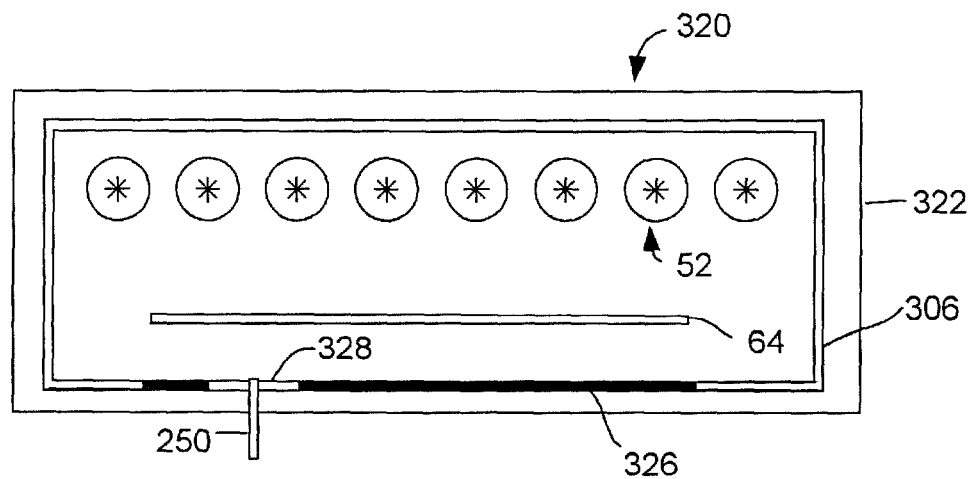
FIG. 20 is a diagrammatic view, in elevation, of another system, having single side heating, which uses a highly reflective area proximate to a pyrometer but which otherwise uses a selective reflective chamber bottom that can be configured, for example, for stray light suppression.

FIG. 20 diagrammatically illustrates a system 320 having single-sided wafer heating using heating arrangement 52 within a chamber 322. A region 326 includes a portion of the chamber bottom, shown as a heavy line, which is exclusive of a region 328 around the pyrometer optics. Region 328 is treated, for example, using a coating, so the reflection spectrum of region 326 is not required to be optimized for the pyrometer. Region 328, however, is configured for high reflectivity in the pyrometer band. With respect to pyrometry performance, region 326 can be optimized, for example, to have a low reflectivity at the pyrometer wavelength for better suppression of stray light, such as is illustrated by FIG. 15. In one alternative embodiment, region 326 can be a broadband absorber for purposes of pyrometry improvement and enhanced wafer cooling.

Figure 21:
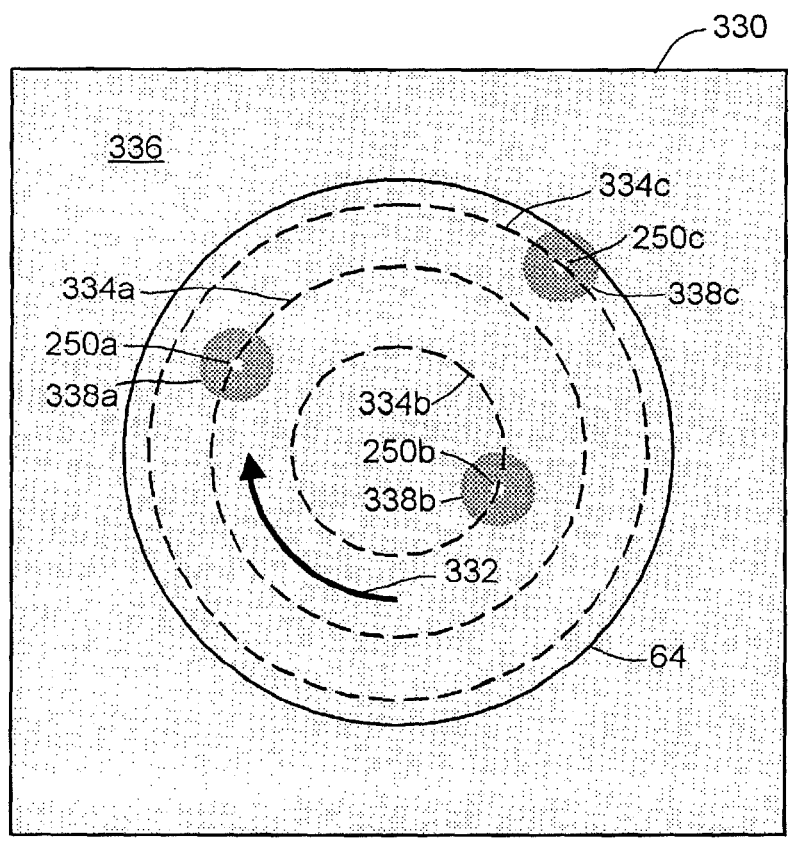
FIG. 21 is a diagrammatic plan view showing a wafer as viewed against a chamber bottom, along with multiple pyrometers, which view the chamber bottom; the wafer is rotated for purposes of enhancing process uniformity.

FIG. 21 is a diagrammatic plan view taken from above wafer 64, which is shown as transparent for illustrative purposes. Wafer 64 is within a chamber 330, produced according to the present invention, having single-side or dual-side heating. Wafer 64 is rotated, as indicated by an arrow 332, past the field-of-view of multiple pyrometers 250a-c (or optics thereof) at various radii 334a-c from the center of the wafer. A selective reflector, or absorber coating 336 is applied on the chamber bottom and can be excluded from regions 338a-c, respectively, around each pyrometer in order to avoid performance compromises in the pyrometry, consistent with the foregoing descriptions. Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein, but may be modified at least within the scope of the appended claims.

What is claimed is:

1. A system for processing a treatment object having a given emission spectrum at a treatment object temperature which causes the treatment object to produce a treatment object radiated energy, said system comprising:
   a heating arrangement for heating the treatment object using a heating arrangement radiated energy having a heat source emission spectrum at a heat source operating temperature which heat source emission spectrum is different from said given emission spectrum of the treatment object; and
   a chamber arrangement exposing said treatment object to a portion of the heating arrangement radiated energy while supporting said treatment object within a treatment chamber such that a first fraction of the heating arrangement radiated energy and a second fraction of the treatment object radiated energy are incident on an outer wall arrangement which forms part of the chamber arrangement, and at least a portion of the outer wall arrangement is configured for responding in a first way to a majority of the first fraction of the heating arrangement radiated energy that is incident thereon while that portion of the wall arrangement simultaneously responds in a second way to a majority of the second fraction of the treatment object radiated energy that is incident thereon, based on a difference between the heat source emission spectrum and the given emission spectrum of the treatment object.

2. The system of claim 1 wherein said chamber arrangement includes a window arrangement supported between said heating arrangement and said treatment object such that said portion of the heating arrangement radiated energy passes through said window arrangement to reach said treatment object and a part of the treatment object radiated energy is incident on the window arrangement.

3. The system of claim 2 wherein said window arrangement provides at least a general drop in transmissivity with increasing wavelength and said general drop in transmissivity occurs at least approximately between 2 µm and 3 µm.

4. The system of claim 2 wherein said window arrangement and said portion of the outer wall arrangement are configured to respond in said second way to the treatment object radiated energy incident thereon by absorbing a majority thereof and said window arrangement reaches a peak temperature during the operation of said system responsive, at least in part, to absorbing said part of the treatment object radiated energy incident thereon such that the part of the treatment object radiated energy and thereby the peak temperature is reduced by said portion of the wall arrangement absorbing the majority of the second fraction of said treatment object radiated energy.

5. The system of claim 2 wherein said window arrangement is configured to respond in said second way to said part of the treatment object radiated energy by absorbing a majority thereof and said window arrangement includes a layered configuration having at least two layers.

6. The system of claim 5 wherein said window arrangement is configured for supporting a layer of flowable material between an adjacent pair of said layers in a way which exposes the flowable material to said portion of the heat source radiated energy and said part of the treatment object radiated energy such that said flowable material responds at least generally in said second way to a majority of the treatment object radiated energy that is incident thereon.

7. The system of claim 1 wherein said portion of the outer wall arrangement includes a treated surface area that is configured to respond in said first way and in said second way and is approximately 20 percent or more of a total surface area that is defined by the outer wall arrangement.

8. A system for processing a treatment object, said system comprising:
a heating arrangement for heating the treatment object using a heating arrangement radiated energy; and
a chamber arrangement for exposing said treatment object therein to one portion of the heating arrangement radiated energy while another portion of the heating arrangement radiated energy is incident on the chamber arrangement, resulting in an overall radiated energy present within the chamber arrangement, said chamber arrangement including a window between said heating arrangement and said treatment object such that the window is opaque, at least to an approximation, at wavelengths longer than an opacity onset wavelength, at least a portion of said chamber arrangement, other than said window, including a selectively reflective configuration which responds in a first way to a majority of said overall radiated energy incident thereon which is of a shorter wavelength than said opacity onset wavelength while simultaneously responding in a second way to a majority of the overall radiated energy that is incident thereon and which is of a longer wavelength than said opacity onset wavelength.

9. The system of claim 8 wherein said selectively reflective configuration responds in said first way by reflecting said majority of the overall radiated energy incident thereon having wavelengths shorter than the opacity onset wavelength and in said second way by absorbing a majority of the overall radiated energy incident thereon having wavelengths longer than the opacity onset wavelength.

10. The system of claim 8 including configuring said selectively reflective configuration with a crossover wavelength based, at least in part on said opacity onset wavelength.

11. The system of claim 8 wherein said window is formed using quartz and said selectively reflective configuration includes a crossover wavelength of approximately 3.7 µm.

12. The system of claim 2 wherein said window arrangement is opaque, at least to an approximation, at wavelengths longer than an opacity onset wavelength, and at least said portion of said chamber arrangement includes a selectively reflective configuration which responds in a first manner to a majority of the heating arrangement radiated energy incident thereon which is of a shorter wavelength than said opacity onset wavelength while simultaneously responding in a second manner to a majority of the heating arrangement radiated energy that is incident thereon and which is of a longer wavelength than said opacity onset wavelength.

13. The system of claim 12 wherein said selectively reflective configuration responds in said first manner by reflecting said majority of the heating arrangement radiated energy incident thereon having wavelengths shorter than the opacity onset wavelength and in said second manner by absorbing a majority of the heating arrangement radiated energy incident thereon having wavelengths longer than the opacity onset wavelength.

14. The system of claim 12 wherein the selectively reflective configuration includes a crossover wavelength based, at least in part, on said opacity onset wavelength.

15. The system of claim 12 wherein said window is formed using quartz and said selectively reflective configuration includes a crossover wavelength of approximately 3.7 µm.

16. The system of claim 4 wherein said portion of the outer wall arrangement is configured for responding in the first way by reflecting the majority of the first fraction of the heating arrangement radiated energy that is incident thereon while simultaneously responding in the second way by absorbing the majority of the treatment object radiated energy that is incident thereon.

17. The system of claim 16 wherein said portion of the outer wall arrangement is configured to absorb any heating arrangement radiated energy and treatment object radiated energy incident thereon which is not reflected from the outer wall arrangement.

18. The system of claim 9 wherein said portion of the chamber arrangement is configured to absorb any heating arrangement radiated energy and treatment object radiated energy incident thereon which is not reflected from the outer wall arrangement.

* * * * *